United States Patent
Lång et al.

(10) Patent No.: US 12,550,488 B2
(45) Date of Patent: Feb. 10, 2026

(54) OPTOELECTRONIC DEVICE

(71) Applicant: Comptek Solutions Oy, Turku (FI)

(72) Inventors: Jouko Lång, Lieto (FI); Marjukka Tuominen, Raisio (FI); Johnny Dahl, Turku (FI); Vicente Alonso, Piispanristi (FI)

(73) Assignee: Comptek Solutions Oy, Turku (FI)

( * ) Notice: Subject to any disclaimer, the term of this patent is extended or adjusted under 35 U.S.C. 154(b) by 717 days.

(21) Appl. No.: 17/616,859

(22) PCT Filed: May 29, 2020

(86) PCT No.: PCT/EP2020/065068
§ 371 (c)(1),
(2) Date: Dec. 6, 2021

(87) PCT Pub. No.: WO2020/254093
PCT Pub. Date: Dec. 24, 2020

(65) Prior Publication Data
US 2022/0310875 A1      Sep. 29, 2022

(30) Foreign Application Priority Data

Jun. 19, 2019   (FI) .................................... 20195541
Jul. 5, 2019    (FI) .................................... 20195617

(51) Int. Cl.
*H10H 20/824*   (2025.01)
*H10H 20/01*    (2025.01)
*H10H 20/84*    (2025.01)

(52) U.S. Cl.
CPC .......... *H10H 20/824* (2025.01); *H10H 20/01* (2025.01); *H10H 20/84* (2025.01); *H10H 20/034* (2025.01)

(58) Field of Classification Search
CPC ... H01L 27/30; H01L 27/3239; H01L 31/143; H01L 31/162; H01L 33/08; H01L 33/18;
(Continued)

(56) References Cited

U.S. PATENT DOCUMENTS

2006/0110839 A1   5/2006  Dawson et al.
2012/0074441 A1*  3/2012  Seo ...................... H10H 20/814
                                                   257/E33.068

(Continued)

FOREIGN PATENT DOCUMENTS

EP       2495761 A2     9/2012
JP     2012182276 A     9/2012

(Continued)

OTHER PUBLICATIONS

Japanese Patent Office, Japanese Office Action, Notice of Reasons for Refusal, Japanese Patent Application No. 2021-570242, Issued Jan. 9, 2024, 7 pages.

(Continued)

*Primary Examiner* — Moin M Rahman
(74) *Attorney, Agent, or Firm* — Ziegler IP Law Group, LLC.

(57) ABSTRACT

The aspects of the disclosed embodiments relates to an optoelectronic device including a substrate layer having a first surface plane and a second surface plane opposite and parallel to the first surface plane. The device also includes a mesa structure arranged on the first surface plane of the substrate layer. The mesa structure includes at least one layer of material; and a first surface arranged at an angle α with respect to the first surface plane of the substrate layer, wherein the angle α is different from 0° and 180°. The device still further includes a first terminating oxide layer of a first type arranged on the first surface of the mesa structure and the first surface of the mesa structure has been cleaned (Continued)

by removing at least 75% of native oxides on the first surface of the mesa structure before arranging the first terminating oxide layer of a first type thereon.

11 Claims, 11 Drawing Sheets

(58) Field of Classification Search
CPC ... H01L 33/24; H01L 51/5032; H01L 25/048; H01L 27/288; H01L 27/32; H01L 33/06; H01L 33/26; H01L 51/0032; H01L 51/50; H01L 2251/50; H01L 51/5068; H01L 51/5084; H01L 51/5296; H01L 2051/0032; H01L 2227/32; H01L 33/52–56; H01L 51/448; H01L 51/5209; H01L 27/3262; H01L 27/3258; H01L 27/3248; H01L 27/322; H01L 51/5225; H01L 51/5268; H01L 2251/558; H01L 2251/303; H01L 2251/306; H01L 2251/308; H01L 51/5218; H01L 51/5271; H01L 51/5275; H01L 51/0005; H01L 51/5012; H01L 51/5206; H01L 51/5221; H01L 51/56; H01L 27/3244; H01L 2227/323; H01L 25/167; H01L 25/0753; H01L 2224/0344; H01L 24/75; H01L 24/98; H01L 2221/68322; H01L 2221/68354; H01L 2224/75822; H01L 2224/7598; H01L 2924/12041; H01L 21/6835; H01L 24/95; H10H 20/00–882; H10H 29/00–142; H10H 29/30–962; H10H 20/814–8142; H10H 20/0145; H10H 20/826–8262; H10H 20/013–0137; H10H 20/824–8252; H10H 20/012–0125; H10H 20/823–8232; H10H 20/0165; H10H 20/817–818; H10H 20/052; H10H 20/01; H10H 20/84; H10H 20/034; H10H 20/821; H10H 20/831; H10H 20/819; H10H 20/042; H10H 20/83; H10H 20/857; H10H 20/032; H10H 20/0364; H10H 20/0363; H10H 20/855; H10H 20/856; H10H 20/82; F21K 9/00–278; H10F 77/147; H10F 77/306; H10F 77/14; H01S 5/18311; H01S 5/18352; H01S 5/423; H01S 2301/176; H10D 62/815; H10D 8/422

See application file for complete search history.

(56) References Cited

U.S. PATENT DOCUMENTS

| | | | |
|---|---|---|---|
| 2014/0124730 A1* | 5/2014 | Choi | H10H 20/841 257/13 |
| 2014/0158415 A1* | 6/2014 | Golda | H01L 21/6835 174/262 |
| 2015/0311366 A1 | 10/2015 | Tsuji et al. | |
| 2016/0172411 A1 | 6/2016 | Tsuji | |
| 2017/0170360 A1* | 6/2017 | Bour | H01L 33/145 |
| 2018/0159005 A1 | 6/2018 | Pokhriyal et al. | |
| 2018/0166856 A1* | 6/2018 | Takeuchi | H01S 5/32341 |
| 2020/0105517 A1* | 4/2020 | Igarashi | H01L 21/02052 |
| 2020/0292391 A1 | 9/2020 | Suzuki et al. | |
| 2022/0028921 A1* | 1/2022 | Jang | H01L 27/153 |

FOREIGN PATENT DOCUMENTS

| | | |
|---|---|---|
| JP | 2015211155 A | 11/2015 |
| JP | 2016111295 A | 6/2016 |
| JP | 2018505567 A | 2/2018 |
| JP | 2020150174 A | 9/2020 |
| WO | 2019020869 A1 | 1/2019 |

OTHER PUBLICATIONS

Notification of Transmittal of The International Search Report and The Written Opinion of The International Searching Authority, or The Declaration, Application No. PCT/EP2020/065068, Mailed Jun. 29, 2020, 12 pages.

Finnish Patent and Registration Office, Search Report, Application No. 20195617, Mailed Jan. 29, 2020, 2 pages.

* cited by examiner

OPTOELECTRONIC DEVICE

TECHNICAL FIELD

The present disclosure relates generally to an optoelectronic device and to a method for manufacturing an optoelectronic device. The optoelectronic device comprises a mesa structure.

BACKGROUND

Optoelectronic devices such as lasers, light emitting diodes, detectors and photovoltaic devices typically consist of epitaxially grown semiconductor heterostructures including quantum well structures and more precisely compound semiconductor material-based structures. An example of the compound semiconductor material is a III-V compound semiconductor, which is obtained by combining group III elements (essentially Al, Ga, In) with group V elements (essentially N, P, As, Sb). In optoelectronic devices, a given semiconductor material is grown epitaxially as a layer on top of another given semiconductor material, thereby generating a heterostructure. Moreover, by using epitaxial-growth fabrication techniques, III-V semiconductors can be fabricated into quantum wells and similar stacked structures, for example for implementing light emitting diode (LED) structures. Furthermore, quantum wells are formed in semiconductors by having a material, such as indium gallium nitride (InGaN), sandwiched between two layers of a material with a wider bandgap, for example gallium nitride (GaN). Other possible examples of material combination may include layer of indium gallium aluminum phosphide (InGaAlP) sandwiched between two layers of indium gallium aluminum phosphide with higher aluminum concentration, and the like. These structures can be grown by processes like, molecular beam epitaxy (MBE) or metal organic chemical vapor deposition (MOCVD). Furthermore, the epitaxially grown III-V compound semiconductor structures can be formed to mesa structures by using lithography techniques commonly known in the art by etching the semiconductor layer vertically. A mesa structure is a multilayer semiconductor structure formed on top of a substrate layer having a surface plane and oblique (or slanting) sides.

As an example of an optoelectronic device, photon generation in light emitting to devices occurs in operation when charge carriers, confined between potential energy barriers induced by the band discontinuities, recombine to generate a photon. The photon has a wavelength that depends upon the energy difference between the quantum wells' corresponding conduction band minimum and valence band maximum; i.e. a band gap energy. Likewise, a photon detection occurs in photodetector devices in operation when a photon, with the higher energy than the band gap energy in the active region, is absorbed generating electron-hole pair that is subsequently collected with the voltage difference applied across the device.

In general, in optoelectronic devices, especially in light emitting devices, there is a requirement for efficient current injection into active quantum well regions of the optoelectronic devices. In a particular example of micro-LED devices, there is a poor device efficiency at the low injection current levels required to drive for instance a micro-led based display. In general, it would be desired that as high percentage as possible of the injected current is transferred to the light generation in the active regions of the devices and thus as many of the electrons injected should recombine with the holes and generate a photon. This is defined as internal quantum efficiency (IQE) of the LED.

The mechanism causing the poor efficiency is thought to be caused by several factors: (i) Shockley-Read-Hall (SRH) recombination of electrons/holes; (ii) Auger recombination; and (iii) electron overflow from the quantum well. Notably, at the low current density operation of the device the main contribution to the IQE drop is caused by non-radiative Shockley-Read-Hall recombination at the defect states, thereby reducing light generation and output. Moreover, this recombination process generates excess heat which reduces the operating lifetime of a given optoelectronic device.

In the particular example of micro-LED devices, as the dimensions shrink, the LED surface-to-volume ratio increases and thus the material surface quality contributes in defining the final device performance. Namely, as the micro-LED mesa structure is processed using etching and lithography techniques, the LED's mesa sidewalls are characterized by high density of atomic level defects and structural disorder which are source for the defect states and the non-radiative SRH recombination and leakage current. Notably, in the example of micro-LED based display devices, as the charge carrier diffusion length can be comparable to the micro-LED size and pixel pitch, the impact of the defective sidewall can extend over large distances and can affect the performance of the entire volume of the chip.

The inherent source for the high density of defects in a typical compound semiconductor based optoelectronic device is the uncontrolled oxidation of the III-V material. The compound semiconductors' oxides are characterized by atomic level bond disorder, broken bonds (dangling bonds) and mixed group III and group V oxides. This nanometres thick oxide layer is prone to generate high density of electrically active defect states in the semiconductor material band gap. Especially group V oxides are prone to contribute to the high defect state density. The formation of such detrimental oxides is prone to happen during the processing of optoelectronic devices. In the particular example of micro-LED device mesa fabrication, after the mesa structure formation with lithography and etching techniques, the mesa surfaces are oxidized.

Contemporarily known semiconductor production facilities address the aforementioned problems, when fabricating optoelectronic device, by employing to some known techniques. One such technique is to fabricate optoelectronic devices wherein there are employed chemical cleaning and passivation of the mesa side wall surfaces. Such a chemical passivation can be for example an ammonium sulfide based passivation or a SU-8 based passivation. A known problem with such passivations are that they are not stable and may oxidize easily. Another such approach is to deposit metal oxide overcoating (e.g. $Al_2O_3$, $SiO_2$) onto mesa side walls using techniques such as atomic layer deposition (ALD), sputtering or plasma enhanced chemical vapor deposition (PECVD). These approaches for fabricating the optoelectronic devices are subject to generate a layer of poor-quality interface oxides and the associated defects as the overcoating materials contain oxygen and the chemical cleaning often is insufficient in removing oxides, especially in aluminum containing compound semiconductor materials.

Therefore, in light of the foregoing discussion, there exists a need to overcome the aforementioned drawbacks associated with conventional semiconductor devices and conventional manufacturing techniques.

The present disclosure thus seeks to provide a solution to the existing problem of poor-quality optoelectronic device mesa surfaces with native oxide layer and the related non-radiative recombination and leakage current. An aim of the present disclosure is to provide a solution that overcomes at least partially the problems encountered in prior art, and provides an economical, easy to implement and sophisticated optoelectronic device.

SUMMARY

The present disclosure seeks to provide an optoelectronic device. The present disclosure also seeks to provide a method of manufacturing an optoelectronic device.

The present disclosure provides an optoelectronic device comprising a substrate layer having a first surface plane and a second surface plane opposite and parallel to the first surface plane. The optoelectronic device further comprises a mesa structure arranged on the first surface plane of the substrate layer. The mesa structure comprises at least one layer of III-V material and a first surface arranged at an angle α with respect to the first surface plane of the substrate layer, wherein the angle is different from 0° and 180°. The device still further comprises a first terminating oxide layer of a first type arranged on the first surface of the mesa structure and the first surface of the mesa structure has been cleaned by removing at least 75% of native oxides on the first surface of the mesa structure before arranging the first terminating oxide layer of a first type thereon.

Present disclosure further provides a method for manufacturing an optoelectronic device, the method comprising
   obtaining a mesa structure arranged on a first surface plane of a substrate layer, the mesa structure comprising at least one layer of III-V material and a first surface arranged at an angle α with respect to the surface plane of the substrate layer, wherein the angle α is different from 0° and 180°;
   cleaning the first surface of the mesa structure by removing at least 75% of native oxides on the first surface of the mesa structure; and
   forming a first terminating oxide layer of a first type on the first surface of the mesa structure.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and apparatus disclosed herein. Moreover, those in the art will understand that the drawings are not to scale. Wherever possible, like elements have been indicated by identical numbers.

Embodiments of the present disclosure will now be described, by way of example only, with reference to the following drawings wherein:

FIG. 100 is P2P X-ray photoelectron spectra from a micro-LED device with native oxide layer on the mesa surfaces.

Figure 1A:
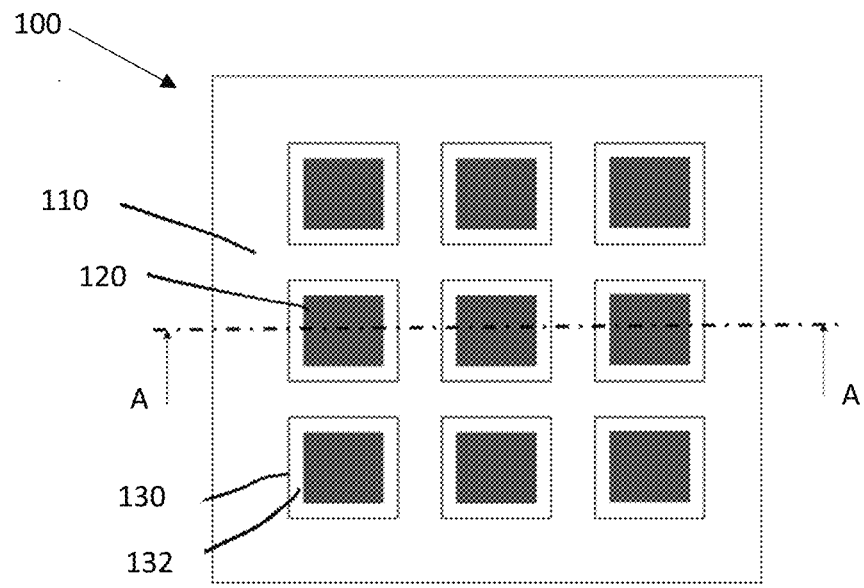
FIGS. 1A and 1B are schematic illustrations of an optoelectronic device according to a first embodiment of the present disclosure.

In the accompanying diagrams, an underlined number is employed to represent an item over which the underlined number is positioned or an item to which the underlined number is adjacent. A non-underlined number relates to an item identified by a line linking the non-underlined number to the item.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practicing the present disclosure are also possible.

The present disclosure provides an optoelectronic device comprising a substrate layer having a first surface plane and a second surface plane opposite and parallel to the first surface plane. The optoelectronic device further comprises a mesa structure arranged on the first surface plane of the substrate layer. The mesa structure comprises at least one layer of III-V material and a first surface arranged at an angle α with respect to the first surface plane of the substrate layer, wherein the angle is different from 0° and 180°. The device still further comprises a first terminating oxide layer of a first type arranged on the first surface of the mesa structure, and the first surface of the mesa structure has been cleaned by removing at least 75% of native oxides on the first surface of the mesa structure before arranging the first terminating oxide layer of a first type thereon.

Present disclosure further provides a method for manufacturing an optoelectronic device, the method comprising
    obtaining a mesa structure arranged on a first surface plane of a substrate layer, the mesa structure comprising at least one layer of III-V material and a first surface arranged at an angle α with respect to the surface plane of the substrate layer, wherein the angle α is different from 0° and 180°;
    cleaning the first surface of the mesa structure by removing at least 75% of native oxides on the first surface of the mesa structure; and
    forming a first terminating oxide layer of a first type on the first surface of the mesa structure.

The present disclosure thus provides a new method of passivating an optoelectronic semiconductor device by creating a terminating oxide layer on surfaces of the mesa structures of the optoelectronic device. Such terminating oxide layer exhibits improved physical and electrical characteristics as compared to native oxides or other oxide layers formed or deposited by methods known heretofore. For these reasons such terminating oxide layer provides a beneficial passivating behavior suppressing the non-radiative recombination at the mesa structure surfaces with improved quality of the interface for subsequent dielectric overcoating deposition. Such terminating oxide layer thus provides an increase in energy barrier for the optoelectronic device for improving carrier confinement within the stacked configuration of the plurality of semiconductor layers formed as a mesa structure.

In the optoelectronic device, the first surface of the mesa structure has been cleaned by removing at least 75% of native oxides on it before arranging the first terminating oxide layer of a first type thereon. The native oxides have undesirably low electrical characteristics, and hence their presence leads to an optoelectronic device of lower quality. Furthermore, it is possible to depict, in the finished product, that the native oxides have been at least mainly removed before formation of the terminating oxide layer. Indeed, the structure of the terminating oxide layer is ordered and hence, at the interface of the first surface of the mesa structure and of the first terminating oxide layer, the order of the oxides of the terminating oxide layer proves that the first surface of the mesa structure has been at least mainly cleaned before forming the first terminating oxide layer thereon. This structure can be analysed for example by using a transmission electron microscope (TEM) or X-ray photoelectron spectroscopy (XPS). The differences between non-cleaned and cleaned surfaces on the final product are also illustrated in the FIG. 3 as explained in more detail below.

It is also to be noted that typically, the rate of conversion or formation of the first terminating oxide layer is not full 100%, i.e. even if at least 75% of the native oxides have been removed, not all locations from where the native oxides have been removed are necessarily covered by a terminating oxide layer. The rate of conversion can be for example 50%. The rate of conversion can be influenced intentionally or unintentionally. An example of intentionally lower conversion rate is the masking or covering of certain areas after removal of native oxides and prior to formation of terminating oxide layer to prevent further modification of the thus underlaying area. An example of unintentionally lower conversion rate is the presence of contamination which can prevent the formation of terminating oxide layer.

In the present description, the term "type" has been used in connection with the terminating oxide layers. By the term "type", it is meant the nature of the terminating oxide layer, i.e. its composition. The various terminating oxide layers used can be identical or different from one another, as is explained in more detail below. The type of the terminating oxide layer thus depends on the oxides present in said layer.

An optoelectronic device can refer to a device which is emitting photons or capable of detecting photons. Examples of such an optoelectronic device are a light emitting diode (LED), a micro-LED, a laser diode, a photovoltaic solar cell, and a photodetector. The present optoelectronic device may also be a part of a matrix of LED's, a matrix of photo detectors or multijunction solar cells. The optoelectronic device is thus a semiconductor device.

The optoelectronic device comprises a mesa structure arranged on top of a substrate layer having a surface plane. The mesa structure refers to isolated semiconductor stacks and comprises at least one layer of III-V material. Each isolated semiconductor stack functions as an optoelectronic component of the optoelectronic device. As an example, optoelectronic devices such as lasers, light emitting diodes, detectors and photovoltaic devices may consist of semiconductor heterostructures including active layers such as quantum well structures and more precisely compound semiconductor material-based structures. The semiconductor heterostructures are typically grown epitaxially on top of a substrate layer. An example of substrate layer is GaAs wafer. Another example of a substrate layer is an epitaxial III-V layer on a wafer. The surface plane of the substrate layer refers to for example (001) plane (in cases of GaAs or epitaxial III-V layer on a wafer) or (0001) plane (in case of GaN).

The mesa structure (i.e. the isolated semiconductor stack) comprises a first surface arranged at an angle α with respect to the first surface plane of the substrate layer. The angle between the surface plane and the first surface can be for example 30-90 degrees. The first surface is a surface which surrounds the mesa structure's sides, i.e. the sloping part. According to an embodiment, the mesa structure also comprises a second surface which is parallel to the first surface plane of the substrate layer. The second surface is the farthest away surface layer of the mesa structure from substrate. The surface layer refers to at least a first atomic layer of the structure.

The first surface is arranged at an angle α with respect to the first surface plane of the substrate layer, wherein the angle is different from 0° and 180°. According to an embodiment, the angle α is 30-90 degrees. Thus, the angle α may be for example from 5, 10, 15, 20, 25, 30, 35, 40, 45, 50, 55, 60, 65, 70, 75, 80, 85, 90, 95, 100, 105, 110, 115, 120, 125, 130, 135, 140, 145, 150, 155, 160, 165 or 170 degrees up to 15, 20, 25, 30, 35, 40, 45, 50, 55, 60, 65, 70, 75, 80, 85, 90, 95, 100, 105, 110, 115, 120, 125, 130, 135, 140, 145, 150, 155, 160, 165, 170 or 175 degrees.

According to an embodiment, the present optoelectronic device comprises also an overcoating on an outermost terminating oxide layer. The function of such overcoating can be, for example, to protect the terminating oxide layer and the rest of the device. Overcoating can also be used to modify the refractive index of the outer surface of the device or to act as an antireflection coating or a high-reflection coating. Thus, the overcoating can have a different thickness at different locations, and can for example comprise peaks.

Moreover, the overcoating can be arranged only on part of the optoelectronic device. Indeed, when used, it is most typically used to protect the terminating oxide layer, but not necessarily the rest of the optoelectronic device. The overcoating can thus be discontinuous, and it can for example be made along a pattern.

The optoelectronic device further comprises a first terminating oxide layer of a first type arranged on the first surface of the mesa structure. In another embodiment a second terminating oxide layer of a second type arranged on the second surface of the mesa structure.

The first terminating oxide layer is arranged to surround the mesa structure, i.e. its sides. The first terminating oxide layer is of a first type. The first type is preferably a terminating oxide layer which is group III oxide dominant. Group III oxide dominant refers to a situation where at least or more than 50% of the total oxide compounds at the surface are group III oxides. It is noted that group V oxides and the related atomic bonds are prone to generate high density of defect states in the bandgap of the semiconductor and thus arranging the surface oxides to group III dominant oxides is intentioned. Furthermore, the first terminating oxide layer formed by the method of the present disclosure preferably exhibits a thickness lower than 10 nm. According to an embodiment, the composition (such as the level of dominancy in percentage) and the thickness of the first terminating oxide layer depends on the materials present on a mesa sidewall, i.e. the first surface.

The second terminating oxide layer, when present, is arranged to cover the second surface of the mesa structure. The second terminating oxide layer is of a second type. In one embodiment, the second type is different from the first type. In another embodiment, the second type is identical to the first type. The second terminating oxide layer is preferably homogeneous in composition and thickness. In an alternative embodiment, the second terminating oxide layer is crystalline terminating oxide layer.

Thus, according to an embodiment, at least 50% of the total oxide compounds of the first terminating oxide layer are group III oxides. According to another embodiment, at least 50% of the total oxide compounds of the second terminating oxide layer are group III oxides. Thus, both the first and second or either of the first and second terminating oxide layers can be predominantly formed of group III oxides.

The mesa structures can be of any form, i.e. when seen from above (perpendicular to the first surface of the substrate layer), the mesa structure can have the form of a square, a rectangle, a circle or an ellipse, or any other suitable form. The mesa structure can have, when seen from the side, linear form, non-linear form, a combination of linear forms with different angles relative to the first substrate plane, a combination of non-linear forms, or a combination of linear and non-linear forms.

In an embodiment, where the optoelectronic device comprises a number of mesa structures (such as 2-10 or 10^-50 or 50-100 mesa structures), these are preferably regularly arranged, or arranged according to a regular pattern (for example in a circle where the mesa structures close to the center of the circle are closer to one another than the mesa structures at the outer circle). The distance between adjacent mesa structures are indicated as a distance between the adjacent centers of mesa structures. The distance between centers of two adjacent mesa structures can be for example 2-500 μm (micrometers). The distance can be for example from 2, 4, 6, 10, 15, 20, 25, 30, 35, 40, 45, 50, 60, 70, 80, 90, 100, 120, 150, 200, 250, 300 or 350 μm up to 10, 15, 20, 25, 30, 35, 40, 45, 50, 60, 70, 80, 90, 100, 120, 150, 200, 250, 300, 350, 400, 450 or 500 μm. According to one embodiment, the optoelectronic device comprises a number of mesa structures, wherein the angle $\alpha$ is larger than 0° and smaller than 180° and the distance between centres of two adjacent mesa structures is 2-500 μm.

According to yet another embodiment, when the optoelectronic device comprises a number of mesa structures, a third terminating oxide layer of a third type is arranged on a surface between two adjacent mesa structures. The third type of terminating oxide layer can be either identical than either the first or optional second terminating oxide layer, or it can be the same as the first and optional second terminating oxide layer, or it can be different from both the first and optional second terminating oxide layer. It is also possible that only a first and third terminating oxide layers are present, without a second terminating oxide layer. The third type of terminating oxide layers may also be such that at least 50% of the total oxide compounds are group III oxides. In this case, the surface is also preferably cleaned before forming the third terminating oxide layer, by removing at least 75% of native oxides on the surface of which the third terminating oxide layer is to be formed.

The amount of group III oxides in the first, optional second and optional third terminating oxide layer is thus preferably at least 50%, while being selected independently for each terminating oxide layer (when more than one is present). According to an embodiment, the amount of group III oxides is at least 50, 55, 60, 65, 70, 75, 80, 85, 90 or 95%.

According to yet another embodiment, the first, optional second and optional third terminating oxide layer may further, independently from one another, comprise some group V oxides, such as up to 20% of the total amount of oxides. For example, the amount of group V oxides is more than 0% but below their detection limit (which is typically 0.1% or 1%). The amount of group V odixes can thus be up to 0.1, 0.5, 1, 1.5, 2, 5, 10, 15 or 20%. It is also possible that the amount of group V oxides is up to 50%.

Thus, according to an embodiment, the first, optional second and optional third terminating oxide layer, independently from one another, comprises at least 50% of oxides of group III and more than 0% of oxides of group V.

In an embodiment, the optoelectronic device may be micro-LED device. Indeed, the optoelectronic device may be a micro-light emitting diode, wherein the footprint of the mesa on the base layer is 1-250000 μm$^2$. The footprint may be for example from 1, 10, 100, 500, 1000, 1500, 2000, 5000, 10000, 10500, 15000, 20000, 50000, 100000 or 150000 μm$^2$ up to 500, 1000, 1500, 2000, 5000, 10000, 10500, 15000, 20000, 50000, 100000, 150000, 200000 or 250000 μm$^2$.

The footprint of the mesa on the base layer is defined as the parallel projection of the mesa structure (i.e. of a single mesa structure) onto the first surface plane of the substrate layer. The base layer in this description stands for that part of the device that is not covered by the mesa structures.

The term "micro" used here refers to the descriptive size of the device and in some embodiment may refer to individual component's lateral dimensions ranging from 1 µm to 500 µm. The sidewalls at the mesa structure of a typical micro-LED device are characterized by defects and associated non-radiative recombination centers for the injected charge carriers creating optically dead area surrounding the micro-LED device with low overall efficiency. This problem is avoided with the present application, thanks to the properties of the terminating oxide layers.

Indeed, the micro-LED device structure is passivated using processes to transform the micro-LED mesa surfaces including sidewall surfaces to terminating oxide layers with the characteristics of reduced amount defects and reduced non-radiative recombination and carrier leakage at mesa surfaces.

Yet in another embodiment, the optoelectronic device is a vertical cavity surface emitting laser (VCSEL), optionally where the minimum lateral dimension is 1 µm. Indeed, the optoelectronic device may be a vertical cavity surface emitting laser, wherein the footprint of the mesa on the base layer is 1-250000 µm$^2$. The footprint may be for example from 1, 10, 100, 500, 1000, 1500, 2000, 5000, 10000, 10500, 15000, 20000, 50000, 100000 or 150000 µm$^2$ up to 500, 1000, 1500, 2000, 5000, 10000, 10500, 15000, 20000, 50000, 100000, 150000, 200000 or 250000 µm$^2$. VCSEL devices may comprise mesa structures with multiple aluminum bearing Group III-V layers like AlGaAs and AlAs layers. The aluminum bearing layers may be protected from the environment in a vertical direction by the top surface, which can include one or more surface passivation layers, i.e. terminating oxide layers. The aluminum bearing layers of known VCSEL devices are typically exposed to the environment at side surfaces of the mesa structures, particularly after the wafer has been cut into individual die. The native oxidation that happens in these materials is uncontrolled and the native oxide layer tickness increases from the edge inward of the aluminum bearing layers, eventually even reaching the VCSEL active layers, and thereby reducing performance or even preventing operation. VCSEL devices are commonly mounted in a hermetically sealed package that can be relatively expensive, and can be relatively bulky. These problems are avoided with the present devices, thanks to the first and optional second terminating oxide layers.

In another embodiment, the optoelectronic device is a photodetector. Indeed, the optoelectronic device may be a photodetector, wherein the footprint of one mesa on the base layer is 1 µm$^2$-100 mm$^2$. The footprint can be for example from 1, 5, 50, 100, 250, 500, 700, 1000 µm$^2$, 0.01, 0.1, 1, 10, 15, 20, 30, 35, 40, 45, 50, 55, 60, 65 or 70 mm$^2$ up to 50, 100, 250, 500, 700, 1000 µm$^2$, 0.01, 0.1, 1, 10, 15, 20, 30, 35, 40, 45, 50, 55, 60, 65, 70, 75, 80, 85, 90, 95 or 100 mm$^2$.

The photodetector typically comprises a multilayer stack of semiconductor materials such as InP, InGaAs, InGaAsP and GaAs, in any combination. The photodetectors typically have at least a p-n junction that converts photons into current which can be collected by applying a voltage across the p-n junction or additionally the photon absorption generates a voltage difference across the p-n junction. The absorbed photons make electron-hole pairs in the depletion region. Photodiodes and phototransistors are a few examples of photodetectors.

Moreover, the present disclosure concerns a new structure of vertically etched optoelectronics device with a terminating oxide layer covering the mesa structure surfaces.

In another aspect of the present disclosure a method for manufacturing an optoelectronic device is provided. The mesa structure is prefabricated (arranged) on the top of a substrate layer. The provided mesa structure which is arranged on top of the substrate layer is further processed by forming the first terminating oxide layer of the first type on the first surface of the mesa structure and optionally forming the second terminating oxide layer of the second type on the second surface of the mesa structure.

The method can be divided in three main steps; step S1 (preparation), step S2 (formation of first and optional second terminating oxide layer) and optional step S3 (overcoating). These are discussed in more detail below.

In the manufacturing method, the materials of the layers exposed in the first and optional second surfaces are prone to formation of a native oxide layer. This oxidation is preferably to be prevented to avoid efficiency decrease of the optoelectronic devices, due to the apparition of dark currents and current leakages caused by the native oxide layer, by mechanisms well known by people skilled in the art.

The method further comprises cleaning the first surface of the mesa structure by removing at least 75% of native oxides on the first surface of the mesa structure. This is typically carried out in at least one cleaning step before forming the first terminating oxide layer. The various possible cleaning steps are explained in more detail below in connection with step S1.

According to an embodiment, the mesa structure comprises a second surface parallel to the first surface plane of the substrate layer, and the method further comprises forming a second terminating oxide layer of a second type on the second surface of the mesa structure. In this case, the second surface is also preferably cleaned before forming the second terminating oxide layer, by removing at least 75% of native oxides on the second surface of the mesa structure.

The method may also comprise removing the substrate layer after forming the first terminating oxide layer and the optional second terminating oxide layer (and optional third terminating oxide layer). When such a step is used, the obtained optoelectronic device no longer comprises the substrate layer. It may optionally be placed on another substrate layer, and in case the angle α was different from 90°, the angle β between the new substrate layer and the first surface of the mesa structure (i.e. the first surface comprising the first terminating oxide layer) is then naturally 90°−α. The transferring of the mesa from one base layer to another can be done with means known in the art. A new surface of the mesa structure may be thus exposed (by removal of the substrate layer) and can be also treated to comprise a terminating oxide layer (which can be the same as one of the other terminating oxide layers or a different one).

Furthermore, the mesa structure can be formed (and not obtained ready-made). The formation of the mesa structure can be made with methods known in the art, for example Reactive Ion Etching (RIE). The etching depth to isolate mesa is selected beforehand. In an example, the material can be etched all the way to the substrate. In another example, the etching leaves material on the substrate between the mesas.

Step S1

In step S1 contaminants, carbon and native oxides are removed from the mesa structure(s). Removing is needed as those are detrimental when forming a first and optional second terminating oxide layer. It may be that the substrate does not have any contaminants and carbon, but in case native oxides are present, at least 75% of them are removed. According to an embodiment, at least 80%, 85%, 90%, 95%, 96%, 97%, 98%, 99% or more of the native oxides are removed. It may even be that only a few Too of the native oxides remain after the cleaning.

According to an embodiment, the process begins with obtaining or providing a substrate with mesa structure formed on a substrate. During the step S1, a sequence of treatments is conducted to remove contamination, carbon and native oxides from the substrate comprising the mesa structure. In an embodiment, the contamination removal consists of wet chemical treatment such as acetone-methanol-isopropyl alcohol treatment. In another embodiment, the contamination removal can be performed under ultrasonic agitation.

In one embodiment, the carbon related atomic species are removed from the surfaces of the mesa structure, in a process step using a wet chemical treatment. Such a process could be acetone-methanol-isopropyl alcohol treatment or additionally RCA cleaning. The details of the RCA cleaning are well known in the art. The treatments can be done under ultrasonic agitation. In another embodiment, the carbon removal step can be a dry cleaning process, such as oxygen plasma process. The oxygen plasma generated for instance in down-stream remote plasma configuration is efficient in creating volatile carbon related species which are removed easily with vacuum pumps used in a plasma chamber configuration.

In an embodiment, after the carbon removal step, native oxides are removed. It is noted that the native oxides of III-V semiconductor exhibit poor characteristics and contain high density of defects and associated electronic states in the semiconductor energy band gap. The native oxides comprise of mixture of group III and group V related oxides, dangling bonds and dimer bonds. Typically, the group V related oxides and the associated electronic states are considered harmful for the performance of the optoelectronic device. The effect of these oxides is shown below in relation to FIG. 10.

In one embodiment of the native oxide removal, wet chemical treatment can be used. As an example, native oxides can be removed from different materials using chemicals such as hydrofluoric acid-based solutions, citric acid-based solutions or sulfuric acid-based solutions. For example, to clean mesa structures that contain materials like InGaAlP, GaAs, AlGaAs, InP, GaP, GaN, InGaN, a hydrochloric acid solution could be used. The molarity of the solution may vary from 0.1 M to 12 M depending on the material and the solvent may be deionized water, isopropyl alcohol or methanol. The etching time may vary from 1 s to 5 min depending on the chosen molarity of the solution as well as the material composition at the mesa structures. In order to avoid re-oxidation of the mesa surfaces after conducting such chemistry, the etching processes may be conducted in inert gas atmosphere whereas the partial content of oxygen in said environment is at least below 1000 parts-per-million (ppm). Other wet etching recipes that could also be used are hydrofluoric acid solutions. The hydrofluoric acid solution may be diluted using de-ionized water, buffered using a buffering agent such as ammonium fluoride. It is noted that in the wet chemical etching techniques, a chemical formulation may vary depending on the materials to be treated.

In another embodiment of the native oxide removal step, dry cleaning process could be used. In one embodiment, the dry native oxide removal process for the surfaces of the mesa structures is arranged for example using atomic hydrogen flux in vacuum conditions. The atomic hydrogen flux can be generated, for instance using remote electron-cyclotron-resonance plasma source or by using hydrogen thermal cracker. A thermal cracker can dissociate the molecular hydrogen into atomic hydrogen. Yet another dry native oxide cleaning process is ion sputtering using noble gases.

According to an alternative embodiment, a dry process to perform the native oxide removal from the surfaces of the mesa structures is performed using ion bombardment such as sputtering utilizing noble gas atomic species such as helium, argon, neon or xenon. In such example, the ion source may be end-hall type gridless ion source with sufficiently low ion energy (<200 eV) but yet high current density minimizing the sputtering damage and ion implantation to the mesa structure but allowing gentle removal of native oxides. In yet another example, the substrate may be biased to negative voltage during ion bombardment to increase the ion energy.

According to an embodiment, after the cleaning as described above (to remove contaminants, native oxides and carbon), the mesa is introduced to ultra-high-vacuum chamber conditions for step S2. By ultra-high-vacuum (UHV) it is meant here the vacuum of which base pressure conditions are within the range of $1 \times 10^{-7}$ to $1 \times 10^{-11}$ mbars.

Step S2

In the first sub-step of S2, the optoelectronic device is heated to an elevated temperature in a degassing step in ultra-high vacuum conditions to essentially evaporate the volatile compounds left at the surfaces of the mesa structure from the previous cleaning steps. In one embodiment of the degassing step, the degassing temperature may vary from 200° C. to 600° C. depending on the materials at the mesa structure. It will be appreciated that a correct temperature and degassing time is required to promote the removal of volatile species from the cleaned mesa structure surfaces. In one embodiment, the temperature can be chosen so that a light removal of group V atoms, such as arsenic and phosphorous, is achieved so that the first atomic layers at the first surface of the mesa structure becomes rich from group III elements.

After the degassing step is conducted, the mesa is processed to form the first terminating oxide layer. The mesa is controllably oxidized to form one or more terminating oxide layers on the surface of the mesa structure.

When the oxygen dose and surface temperature are selected correctly, the oxygen is absorbed into the surface and causes the transformation of the surface structure to good quality terminating oxide layer.

Indeed, in one embodiment, the oxidation conditions are chosen so that that the process promotes the generation of volatile group V oxides which are easily removed from the surfaces at elevated temperatures, thus making the first atomic layers at the surfaces of the mesa structures deficient from group V atoms and transforming the surfaces to good quality group III related oxides. The effect of removal of group V species can be monitored using for instance reflection high energy electron diffraction (RHEED), x-ray photoelectron spectroscopy (XPS) or monitoring by a mass-spectrometer during the degassing procedure. The effect of such treatment is explained in more detail below in connection with FIG. 9.

In one embodiment, a metal deposition step is conducted prior the terminating oxide layer formation by evaporating for example 0.2-10 monolayers (MLs) of In, Ga or Sn metals on the surfaces of the mesa structure resulting in group III or group IV rich surface layer. By conducting such metal deposition, the resulting surface is more susceptible for the formation of group V deficient terminating oxide layer.

According to an embodiment, the first terminating oxide layer is of a first type. The first type is a compound semiconductor oxide layer rich in group III oxides and with a thickness of less than 10 nm. More details are given in connection to FIGS. 9 and 10 below.

The optional second terminating oxide layer is of a second type. The second type depends on the processing conditions and geometries. The second type is a compound semiconductor oxide layer rich in group III oxides and with a thickness of less than 10 nm. Furthermore, if the planar surface of the structure has a crystal orientation of (001), the second terminating oxide layer may be crystalline terminating oxide layer.

As an example, the terminating oxide layers may be manufactured by employing an oxygen flux in vacuum conditions. The first and optional second terminating oxide layers can be fabricated by administering oxygen (as gaseous form, as $O_2$ or $O_3$, or for example with $H_2O_2$ being present) to heated surfaces of a mesa structure. Additionally, the administered oxygen may be generated at a plasma source which produces highly reactive atomic oxygen. Such plasma source may be electron-cyclotron-resonance plasma source installed remotely from the processed sample. When the oxygen dose and surface temperature are selected correctly, the oxygen is absorbed into the surface and causes the transformation of the surface structure into good quality terminating oxide layer. In one embodiment, the oxidation conditions are chosen so that the process promotes the generation of group V oxides which are highly volatile and easily removed from the surfaces at elevated temperatures, thus making the top most atomic layers at the surface of the mesa structures deficient from group V atoms and transforming the surfaces to good quality group III related oxides. Typically, only oxygen is used as a reagent, as compared to the more traditional oxide layer formation processes which typically involve using more than one element reaction and where new oxide material is grown onto the surface instead of transforming the existing surface.

As a further example, an external surface of the mesa structure is heated to a temperature of at least 200° C. and up to 750° C. for supporting an oxidation process. The temperature is selected depending on the material composition of the external surfaces. The reaction typically takes place in vacuum conditions, with the chamber background pressure being typically in the range of $1 \times 10^{-11}$ to $1 \times 10^{-7}$ mbar. Subsequently, the external surfaces of the mesa structure are exposed to a flux of oxygen atoms, molecules, ozone or another oxidizer such as $H_2O_2$ at the selected temperature. The partial pressure of oxygen during the oxidation process may vary from $5 \times 10^{-8}$ to $5 \times 10^{-3}$ mbar depending on the material composition of the treated mesa structure. Furthermore, the oxidation time may vary between 5 seconds and 60 minutes. In yet another embodiment, the terminating oxide layer is formed in an oxidation process under UV light irradiation under vacuum conditions. The UV irradiation can promote the formation of more reactive singlet oxygen quantum state for oxygen molecules during the oxidation process. Furthermore, the UV irradiation with short wavelength has an effect of breaking surface atomic bonds and thus promoting surface reactions. An example of a surface reaction promoting wavelength is 172 nm.

In an additional or alternative embodiment, indium atoms are deposited onto the mesa surfaces prior to transforming the surfaces to terminating oxide layers. Alternatively, tin atoms can be deposited onto the mesa surfaces prior to transforming the surface to a terminating oxide layer. In yet another example, gallium atoms are deposited onto the mesa surfaces prior to transforming the surface to terminating oxide layers. The deposition of metal atoms to the cleaned mesa surfaces has the effect of creating a thin group V deficient layer at the surfaces of the mesa structure to promote the formation of group III or additionally group IV (Sn) related oxides during the terminating oxide layer formation. In such embodiments the deposition amount of metals is between 0.2 ML to 10 MLs (monolayers). For the deposition of such metal layers, thermal evaporator such as effusion cells or additionally electron beam evaporation may be used.

The process conditions for the creation of the terminating oxide layer may happen under UHV conditions, thus the process may happen under a free molecular flow regime where the mean free path of the molecules is larger than the size of the chamber where it takes place. Molecules can easily collide with any surface in the chamber. This characteristic allows the process to well conform to 3D surfaces.

After the terminating oxide layer formation step, the mesa structure is preferably cooled down to below 100° C. in UHV conditions in a cooling step.

Step S3

As an optional step, after the creation of the terminating oxide layer(s), the optoelectronic device can be transferred for the deposition of an overcoating. The overcoating deposition can be conducted for instance by using Chemical Vapour Deposition (CVD), ALD or PECVD or by sputtering deposition. Examples of overcoating layers are $Al_2O_3$, $HfO_2$, $SiN_x$ or $SiO_2$. A preferred process is to do the transfer via vacuum transfer lines in order to minimize the contamination absorption, although transfer by air has been also proven to provide good results. The transfer can also happen under UHV conditions or under high vacuum conditions or transferred through air or under inert gas environment.

The effect of the cleaning during the manufacturing is also, that the overcoating layer can be made without creating a disordered interface between the overcoating layer and the underlying semiconductor, because the terminating oxide layer is well ordered.

In one embodiment, the vacuum transfer includes also a degassing step. After the overcoating deposition, post-annealing treatment such as rapid-thermal-annealing (RTA) can be done to improve the layer quality.

Thus, according to an embodiment, the method further comprises depositing an overcoating on the terminating oxide layer. The terminating oxide layer means here any terminating oxide layer present on the mesa.

In such additional embodiment, there is provided a benefit of the creation of oxygen containing structures on mesa surfaces (the oblique side surfaces of the mesa structure) which are resistant to further oxygen exposure, and are characterized with low amount of atomic level defects. The embodiments are suitable, for example, for optoelectronic and photovoltaic applications comprising quantum well (QW) semiconductor material structures formed as mesa structures. The semiconductor device typically comprises a stacked configuration of a plurality of semiconductor layers, such that the plurality of semiconductor layers is operable to accommodate charge carriers.

The beneficial effect of the terminating oxide layer(s) and its(their) passivating effect can be measured by assessing the minority carrier lifetime of the device. This measurement can be done for instance using time-correlated-single-photon-counting method thus addressing the time resolved photoluminescence characteristics of the device. Carrier lifetime is defined as the average time that it takes for a minority carrier to recombine. In a typical case with a material system with high density of defects, the minority carrier lifetime is short due to carrier loss due to non-radiative recombination. The effect of the terminating oxide layer is shown in connection with FIG. 6 below.

Figure 7:
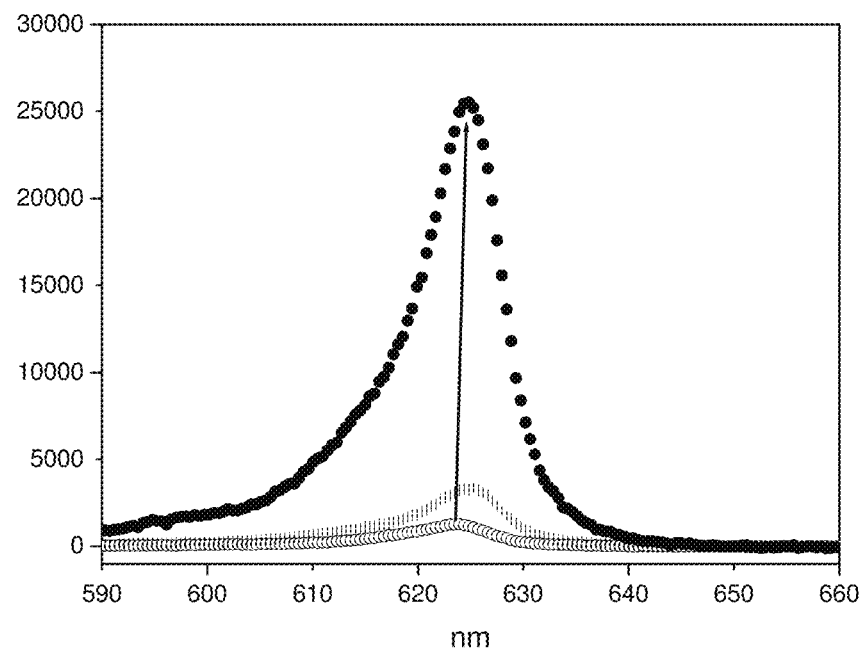
FIG. 7 shows photoluminescence spectra, illustrating a typical micro-LED device without passivation and with native oxide layer, a micro-LED device passivated using prior art techniques and a micro-LED device processed according to an eight embodiment of the present disclosure.

Additionally the effect of the terminating oxide layer can also be characterized by photoluminescence (PL) spectroscopy. In this technique, the microLEDs surfaces are excited by an external laser with a wavelength corresponding to an energy greater than the semiconductor material bandgap. After the excitation, the generated charge carriers recombine and in case of radiative recombination, the semiconductor material emits light. The intensity of photoluminescence is affected, among other things, by the amount of surface state defects created by for example poor quality oxides. In case of high density of defects, the SRH recombination is dominant and the photoluminescence intensity emitted by the material is in general lower when compared to material with low density of defects. An example is shown in FIG. 7 below. The emission levels obtained with the devices that have terminating oxide layers are several times higher than same microLED devices which have been passivated with known passivation techniques.

In the manufacturing process the steps S1, S2 and S3 are typically done in separate chambers. These and other chambers can be isolated from each other with gate valves, which can allow the transfer of material through them when in open position. Additionally, the equipment will have different components to monitor and to produce different steps of the process S1, S2 and S3, such as pressure and temperature gages, heaters, vacuum pumps, plasma sources, plasma guns, sputtering heads, gas lines, leak valves etc.

In accordance with the present disclosure a method of passivating a semiconductor device comprising a stacked configuration of a plurality of semiconductor layers processed to form mesa structures, is provided. The plurality of semiconductor layers is operable to accommodate charge carriers, where the method consists in treating the mesa structures by first cleaning the exposed surfaces from carbon and contaminants, and secondly removing the native oxides (which hold bad electrical characteristics) and after that forming the said terminating oxide layer by a process with controlled conditions such as UHV conditions, substrate temperature, time, partial pressure of gases, and other, in a process that is conformable to 3D shapes.

In an embodiment a substrate was provided which contained a mesa structure with the first surface of the mesa comprising InAs. The surfaces of the mesa were cleaned from contamination and carbon with solvents. The used solvents were acetone, methanol and isopropyl alcohol. The sample was submerged in each solvent for 1 minute. The mesa was subsequently cleaned from native oxides with argon ion sputtering. The ion gun filament current was 15 mA, ion gun voltage was 2 kV, the argon partial pressure was $3*10^-6$ mbar and the sputtering time was 15 min. The mesa was then introduced to a UHV chamber having background pressure $1*10^-9$ mbar. The mesa was degassed in UHV conditions with annealing to 450° C. for 30 minutes. The obtained surface ready for oxidation showed (4×2) reconstruction under low energy electron diffraction measurement. Molecular oxygen gas was used as a reagent for the oxidation. The oxygen gas partial pressure was $3*10^-6$ mbar and the oxidation time was 15 min. The result was first terminating oxide layer containing 90% III-oxides and 10% V-oxides.

Additional aspects, advantages, features and objects of the present disclosure would be made apparent from the drawings and the detailed description of the illustrative embodiments construed in conjunction with the appended claims that follow. It will be appreciated that features of the present disclosure are susceptible to being combined in various combinations without departing from the scope of the present disclosure as defined by the appended claims.

DESCRIPTION OF THE DRAWINGS

Figure 1B:
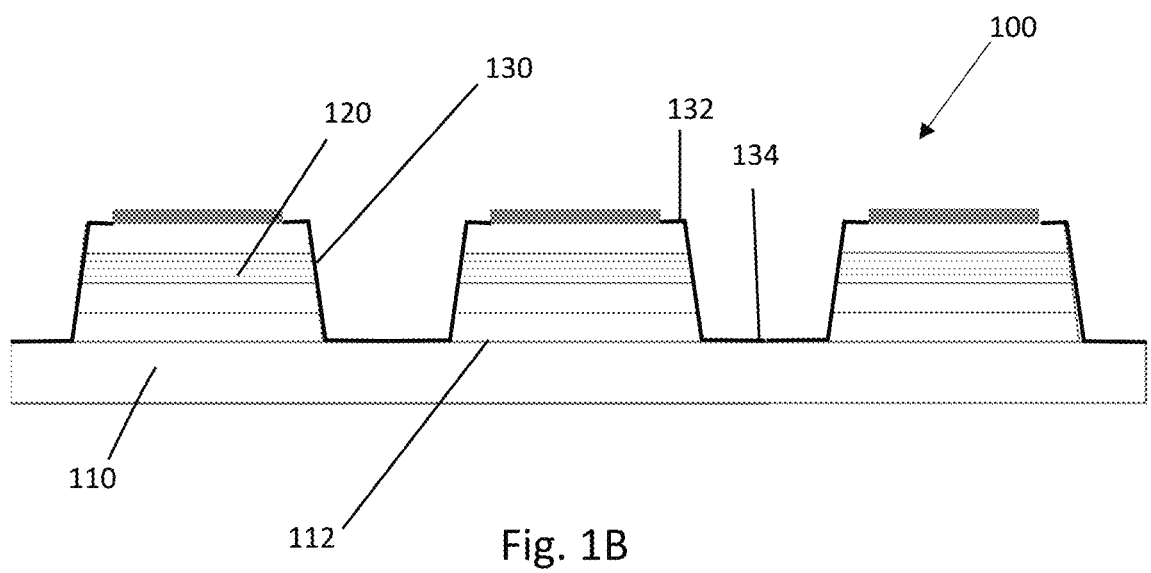

FIG. 1A is a schematic illustration of an optoelectronic device 100 seen from above, according to an embodiment. FIG. 1B is an illustration of a cross section A-A of the optoelectronic device 100. The optoelectronic device 100 of the FIG. 1A comprises nine mesa structures 120. Each mesa structure is arranged on a top of a substrate layer 110, i.e. on its first surface plane. The first surface plane 112 of the substrate layer 110 is indicated in FIG. 1B. A first terminating oxide layer 130 of a first type is arranged on the first surface of the mesa structure 120. As illustrated in FIG. 1A, the first terminating oxide layer 130 surrounds the mesa structure from all side directions. A second terminating oxide layer 132 is arranged on a second surface of the mesa structure 120. The second oxide layer 132 is parallel to the surface plane 112 of the substrate layer 110. In addition, a third terminating oxide 134 layer has been formed on top of the substrate layer, between the mesa structures.

Figure 2A:
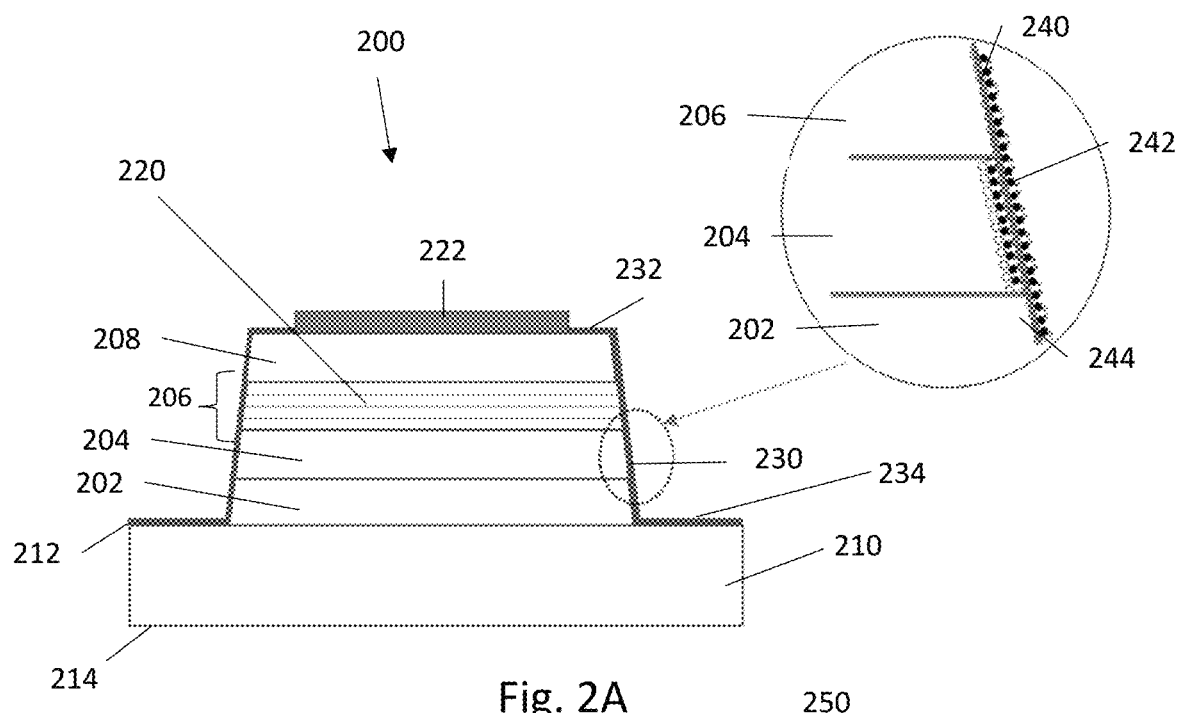
FIGS. 2A, 2B and 2C are schematic illustrations of an optoelectronic device, according to further embodiments of the present disclosure.
Figure 2B:
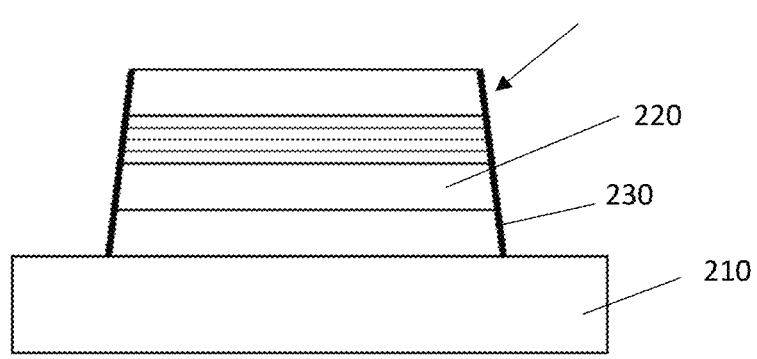
Figure 2C:
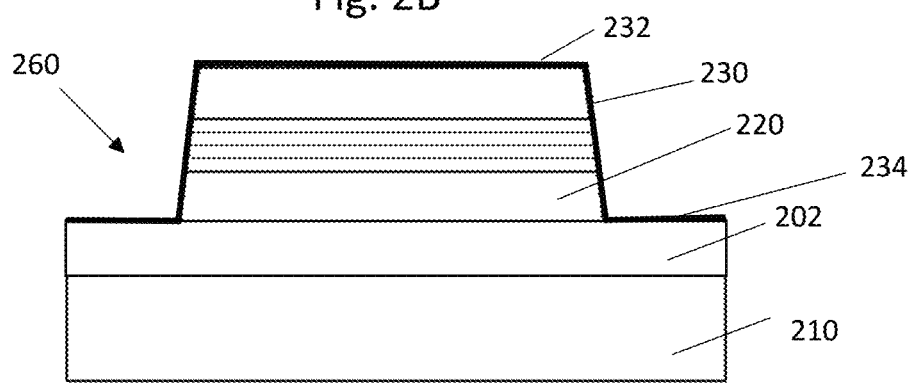

FIGS. 2A, 2B and 2C are schematic illustrations of an optoelectronic device, according to further embodiments. In FIG. 2A, an optoelectronic device 200 includes a mesa structure 220 arranged on top of a substrate 210, i.e. on its first surface plane. The first surface plane 212 is opposite and parallel to a second surface plane 214. The mesa structure 220 comprises a first layer 202 (buffer layer in case of optoelectronic device being LED or micro-LED) epitaxially grown on top of the substrate, a second layer 204 grown on top of the first layer, an active region 206 grown on top of the second layer and a third layer 208 grown on top of the active region. A first terminating oxide layer 230 of the first type is arranged on the first surface of the mesa structure 220. A second terminating oxide layer 232 of the second type is arranged on the second surface of the mesa structure 220. Illustrative enlargement of the first surface is also provided in FIG. 2A. It can be seen that thickness of the first terminating oxide layer 230 varies depending on the material of the layer of the mesa structure. As seen in the illustrative enlargement, layer 206 comprises at its side a portion 240 of the terminating oxide layer which thickness is different than the thickness of a portion 242 that is arranged on the epitaxial layer 204. The layer 208 comprises on its side a portion 244 of the terminating oxide layer which thickness is similar to the thickness of portion 240. Furthermore, a contact 222 is formed on top of the third layer 208 and a third terminating oxide layer 234 is arranged on the surface of the substrate layer.

FIG. 2B shows another optoelectronic device 250 according to another embodiment. In this embodiment, a mesa structure 220 has been formed on the substrate 210, but only its first surface has been treated to comprise the terminating oxide layer 230. In FIG. 2C, yet another optoelectronic device 260 is shown, comprising a mesa structure 220, a first terminating oxide layer 230, a second terminating oxide layer 232 and a third terminating oxide layer 234. In this embodiment, the mesa structure has been manufactured such that the first layer 202 has been left on the substrate layer 210, i.e. not etched away.

Figure 3A:
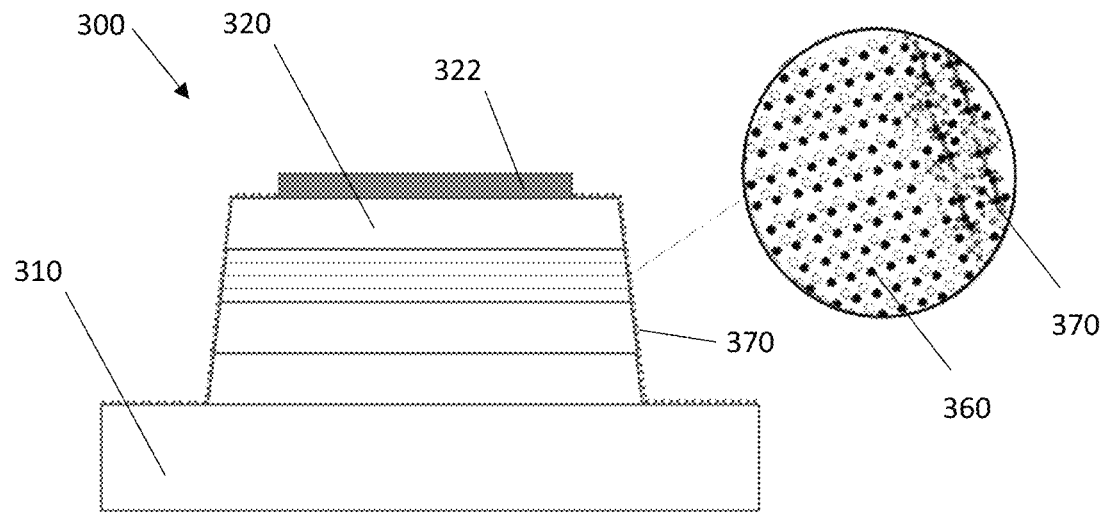
FIG. 3A is a schematic illustration of an optoelectronic device with native oxide on mesa structure surfaces.

FIG. 3A is a schematic illustration of an optoelectronic device 300 with native oxide on mesa structure surfaces. A mesa structure 320 is arranged on top of a substrate 310. The mesa structure 320 comprises a contact layer 322 fabricated for example using lithography techniques on top of the mesa structure 320, and a native oxide layer 370 on top of the surfaces of the crystalline semiconductor material 360 of the mesa structure 320. The native oxide layer 370 is also illustrated in the partial enlargement of FIG. 3A.

Figure 3B:
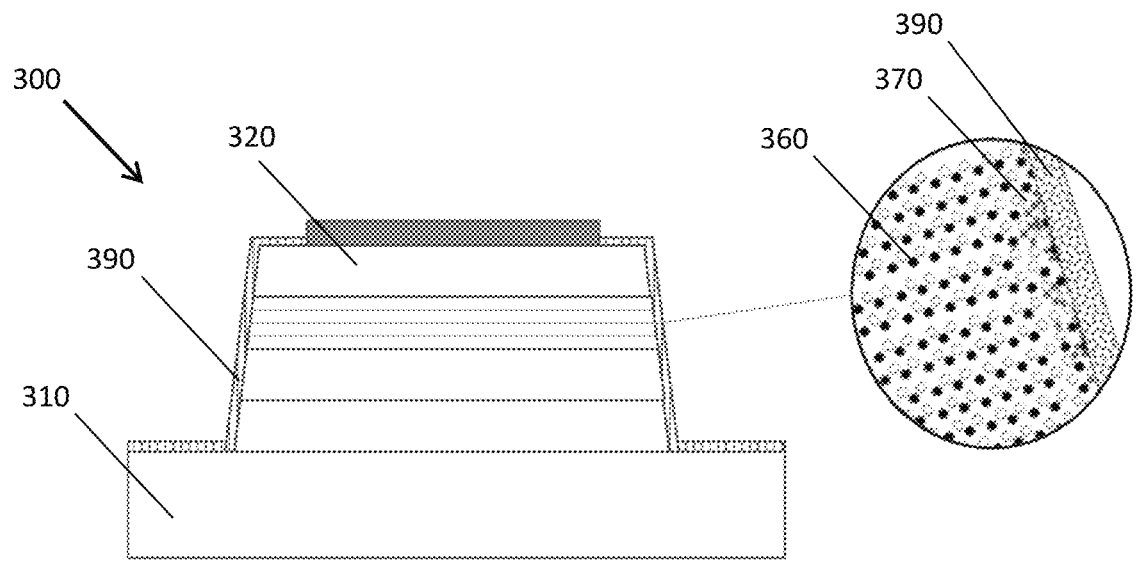
FIG. 3B is a schematic illustration of an optoelectronic device with overcoating layer on top of a native oxide.

FIG. 3B is a schematic illustration of the optoelectronic device 300 with overcoating layer on top of a native oxide. A mesa structure 320 is arranged on top of a substrate 310. The mesa structure 320 comprises a native oxide layer 370 on top of surfaces of the crystalline semiconductor material 360 of the mesa structure 320 and a dielectric layer 390 arranged on top of the native oxide layer 370. The dielectric layer 390 is also illustrated in the partial enlargement of FIG. 3B. FIG. 3B thus illustrates an optoelectronic device manufactured according to known methods and in the enlargement of FIG. 3B, it can be seen that in the interface, the oxides are not ordered.

Figure 3C:
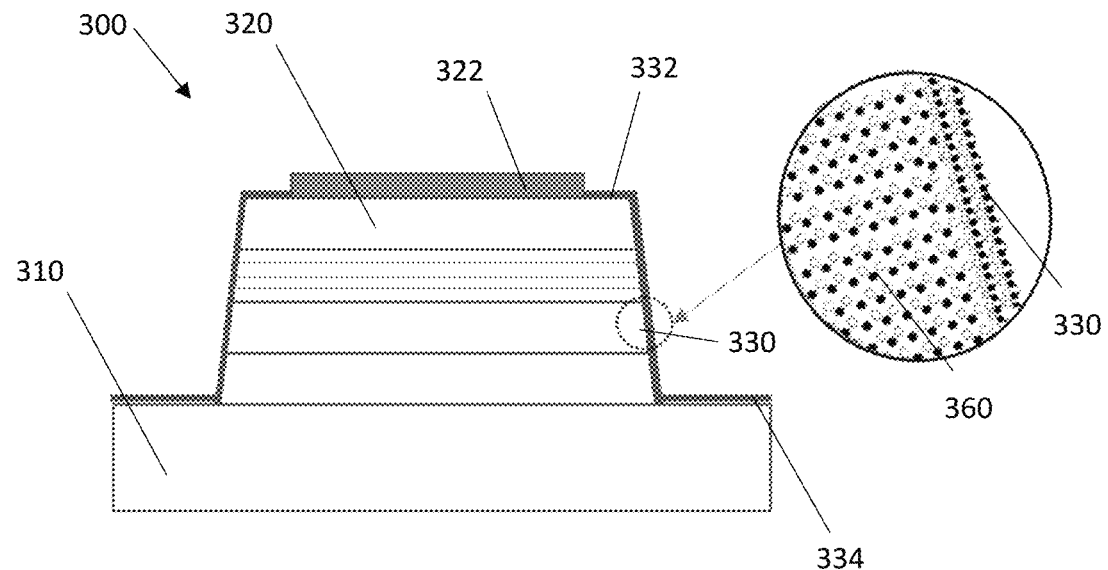
FIG. 3C is a schematic illustration of an optoelectronic device with terminating oxide layer according to a third embodiment of the present disclosure.

FIG. 3C is a schematic illustration of the optoelectronic device 300 with terminating oxide layers according to a third embodiment of the present disclosure. A mesa structure 320 is arranged on top of a substrate 310. The mesa structure 320 comprises a contact layer 322 fabricated for example using lithography techniques on top of the mesa structure 320. Furthermore, a first terminating oxide layer 330 of the first type and a second terminating oxide layer 332 of a second type are arranged on the surfaces of the crystalline semiconductor material 360 of the mesa structure 320, and a third terminating oxide layer 334 is arranged on the surface of the substrate layer 310. The first terminating oxide layer 330 is also illustrated in the partial enlargement of FIG. 3C and the enlargement shows how well the oxides are ordered on the interface. This schematically illustrates how it is possible to depict, in the finished product, that the native oxides have been at least mainly removed before formation of the terminating oxide layer.

Figure 3D:
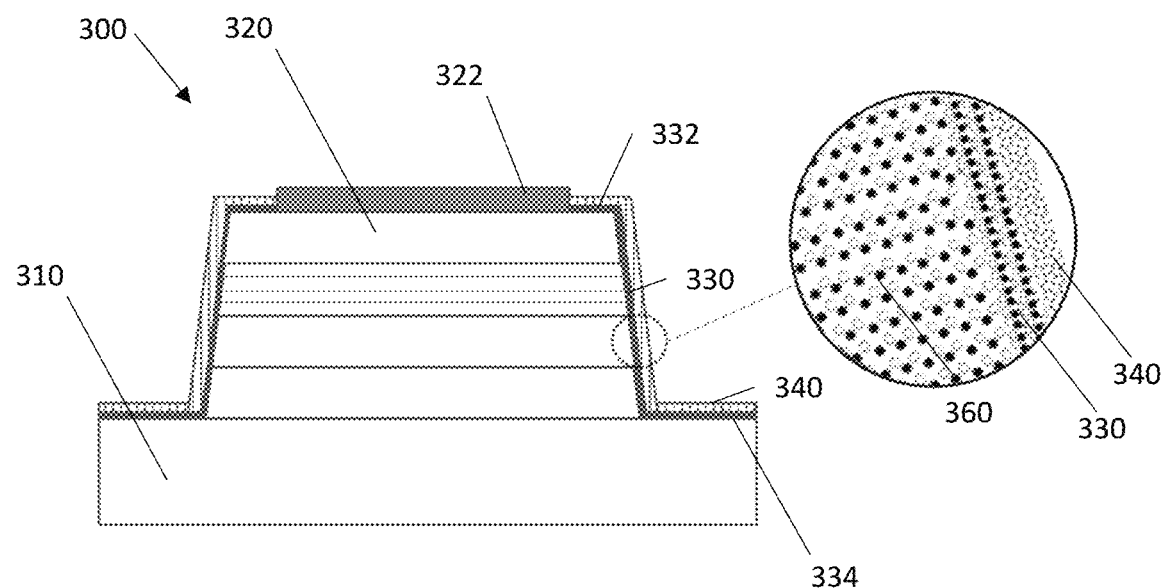
FIG. 3D is a schematic illustration of an optoelectronic device with terminating oxide layer and dielectric overcoating layer according to a fourth embodiment of the present disclosure.

FIG. 3D is a schematic illustration of the optoelectronic device 300 with terminating oxide layers and dielectric overcoating layer according to a fourth embodiment of the present disclosure. A mesa structure 320 is arranged on top of a substrate 310. The mesa structure 320 comprises a contact layer 322 fabricated using for example lithography techniques on top of the mesa structure 320, a first terminating oxide layer 330 of the first type and a second terminating oxide layer 332 of a second type arranged on the surfaces of the crystalline semiconductor material 360 of the mesa structure 320. a third terminating oxide layer 334 is arranged on the surface of the substrate layer 310. In this illustration a dielectric overcoating 340 is arranged on top of the terminating oxide layers 330, 332 and 334. These are also illustrated in the partial enlargement of FIG. 3D.

Figure 4:
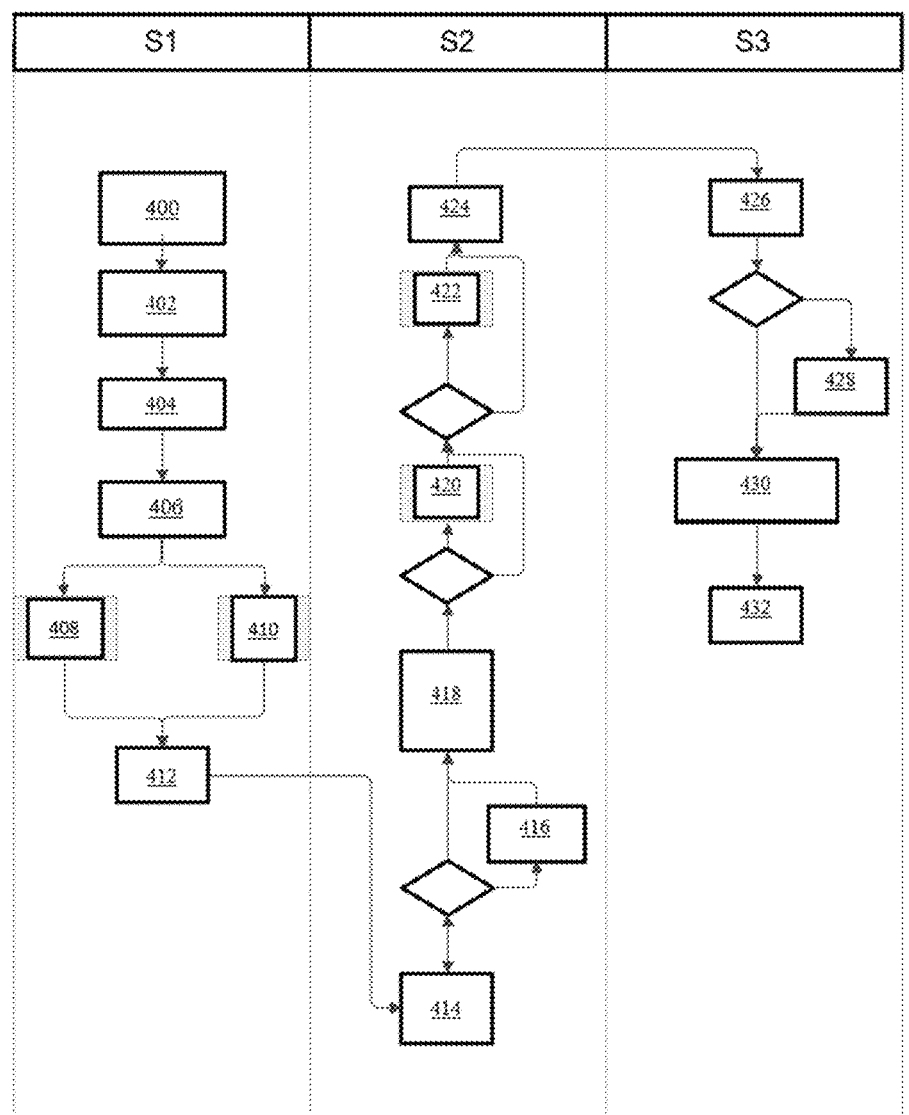
FIG. 4 is a schematic illustration of a process flow according to a fifth embodiment of the present disclosure.

FIG. 4 is an illustration of the process flow according to an embodiment of the present disclosure. The process flow describes the main process steps S1 (preparation), S2 (formation of the terminating oxide layer) and S3 (overcoating). The process begins with providing a substrate with patterned mesa structure formed on a substrate 400. During the step S1, a sequence of treatments 402, 404 and 406 are conducted to remove contamination, carbon and native oxides. In this embodiment the contamination removal 402 consists of wet chemical treatment such as acetone-methanol-IPA treatment. In one embodiment of the carbon removal process 404, a wet chemical treatment is used, such as acetone-methanol-isopropyl alcohol treatment or additionally RCA cleaning. In another embodiment the carbon removal step 404 will be conducted using dry cleaning processes such as oxygen plasma process. After the carbon removal step 404, native oxides are removed in step 406. In one embodiment of the native oxide removal 406, wet chemical treatment 410 will be used, such as hydrochloric or hydrofluoric acid-based treatment. In another embodiment of the native oxide removal step 406, dry cleaning process 408 will be used such as atomic hydrogen treatment or ion sputtering using noble gases. After the native oxide removal step 406, the cleaned patterned substrate with mesa structures is introduced to ultra-high-vacuum chamber in step 412 of S1. A degassing step 414 of cleaned mesa structures is then made in a controlled manner by annealing the mesa structures between 200° C. to 600° C. After degassing step 414, in one embodiment a metal deposition step 416 is conducted by evaporating 0.2-10 MLs of In, Ga or Sn metals on the surfaces of the mesa structure resulting in group III or group IV rich surface layer. Terminating oxide layer is arranged in step 418 either after the degassing step 414 or after the metal deposition step 416. In one embodiment, the terminating oxide layer is arranged in step 418 by administering oxygen (as gaseous form, as $O_2$ or $O_3$, or for example with $H_2O_2$ being present) to heated surfaces of the mesa structures. After the terminating oxide layer formation step 418, the mesa structure can optionally undergo a post oxide formation high temperature anneal step 420. Additionally, the mesa structure can undergo a UV activation step 422. At step 424 the mesa is cooled down below 100° C. in ultra-high-vacuum conditions in step 424. After cooling the mesa structure in step 424, transfer to overcoating equipment is conducted in step 426 of S3. The transfer can happen under ultra high vacuum conditions or under high vacuum conditions in step 428 or transferred through air or under inert gas environment. In one embodiment the UHV transfer includes also degassing step in 428. Subsequently, dielectric overcoating is deposited in step 430, for instance using atomic layer deposition, plasma enhanced chemical vapor deposition or by sputtering deposition. After the dielectric overcoating deposition, post-annealing treatment can be done in step 432.

Figure 5:
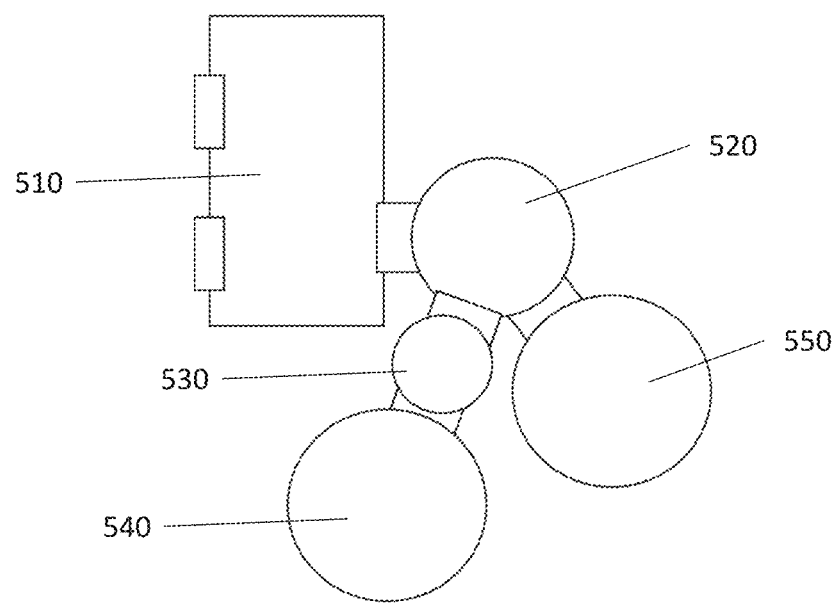
FIG. 5 is a schematic illustration of a processing equipment according to a sixth embodiment of the present disclosure.

FIG. 5 is a schematic illustration of processing equipment according to an embodiment of the present disclosure. The processing equipment comprises a glove box 510, where wet preparation processes can take place under inert controlled atmosphere, i.e. nitrogen atmosphere with oxygen concentration of less than 100 ppm. The glove box 510 is connected to a transfer chamber 520, where a transfer mechanism to move the devices from the glove box to a different part of the equipment is mounted, for example a robot, or in another example a linear transfer rod system. The transfer chamber allows sample transfer with the required vacuum level between the chambers. The transfer chamber is connected to a buffer chamber 530 that connects the transfer chamber 520 and the oxidation chamber 540 and which allows a necessary high vacuum level to be achieved for the transferring of the sample to the terminating oxide layer formation chamber 540. The reason for the buffer chamber is to compensate the different pressure levels required for the different steps, for example pressure in oxidation chamber 540 could be in the level of $10^{-10}$ mbar, while in the transfer line 520 could be for example $10^{-6}$ mbar. By adapting the pressure in the buffer chamber 530, which is significantly of smaller volume than the other chambers, the process time is reduced. The transfer chamber 520 is also connected to an overcoating deposition chamber 550 where the deposition of the dielectric materials can take place. The overcoating chamber 550 can be for instance atomic layer deposition chamber or plasma enhanced chemical vapor deposition chamber.

Figure 6:
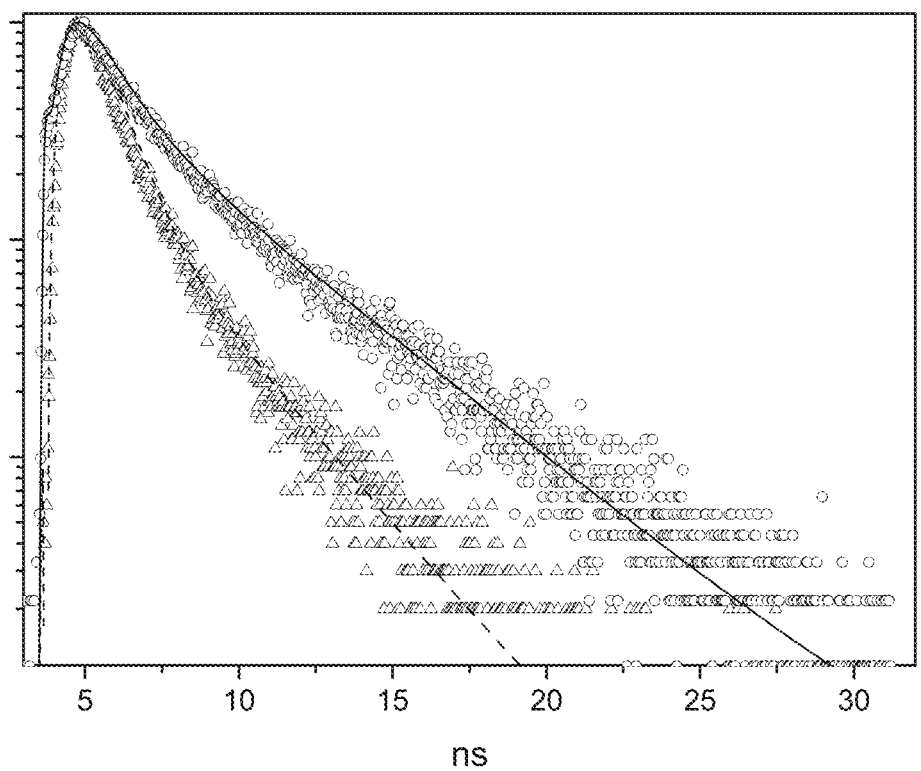
FIG. 6 shows carrier lifetime decay curves, measured using time-correlated-single-photon counting, from a micro-LED device with native oxide and a micro-LED device processed according to a seventh embodiment of the present disclosure.

FIG. 6 is an illustration a charge carrier lifetime decay curve, measured using time correlated single photon counting method, from standard micro-LED device with native oxide layer at the micro-LED mesa structure surfaces, and a lifetime decay curve from micro-LED device with terminating oxide layer at the micro-LED mesa structure surfaces. Both devices are based on InGaAlP based microLED arrays of sizes below 5 μm. The carrier lifetime is defined as the average time that it takes to a minority carrier to recombine. In typical case with a material system with high density of defects the minority carrier lifetime is short due to carrier loss due to non-radiative recombination. In FIG. 6, the device with terminating oxide layer shows that the carrier lifetime is improved substantially. In the FIG., lifetime (in ns) is shown on the abscissa and the counts (in absolute units) on the ordinate. The triangles show the results for a standard microLED (<τ> approximately 2.8 ns) and the circles the results for a microLED comprising the terminating oxide layers according to the present disclosure (<τ> approximately 3.5 ns).

FIG. 7 is an illustration of a photoluminescence spectrum from a standard micro-LED device with native oxide layer at the micro-LED mesa structure surfaces (lowest curve), and a photoluminescence spectrum from a micro-LED device wherein the micro-LED mesa structure surfaces are passivated using prior-art techniques (middle curve), and a photoluminescence spectrum from a micro-LED device with terminating oxide layer at the micro-LED mesa structure surface according to an embodiment of the present disclosure (uppermost curve). The wavelength (in nm) is shown on the abscissa and the photoluminescence intensity (in counts) on the ordinate. The devices were microLEDs based on InGaAlP material, of 10 μm in size, and reference to the lower, middle and uppermost curve is to be seen in the middle of the graph.

Figure 8:
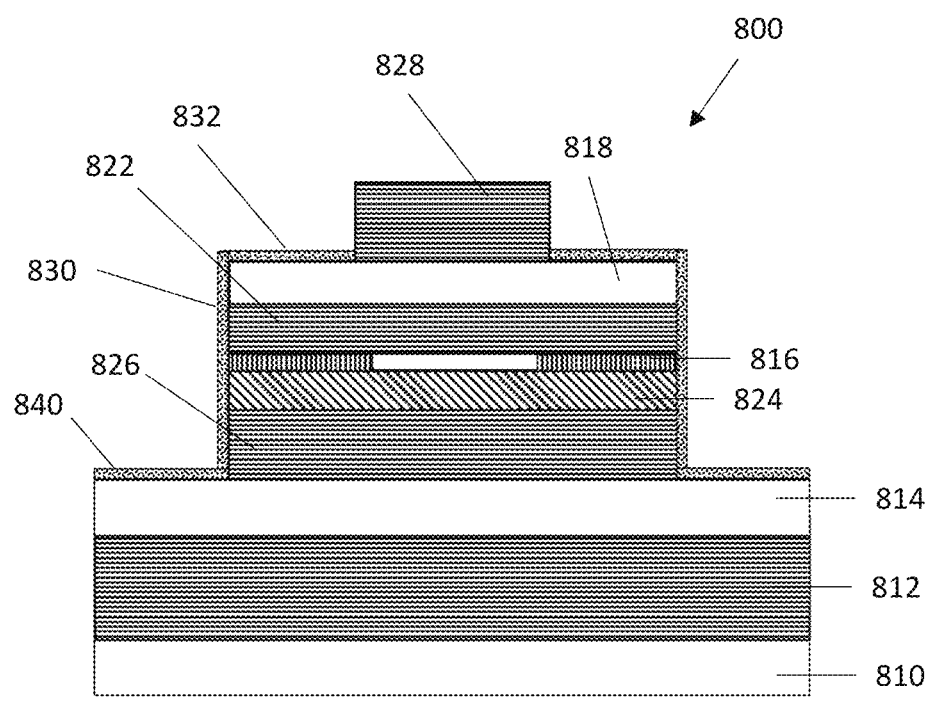
FIG. 8 is a schematic illustration of vertical cavity surface emitting laser diode according to a ninth embodiment of the present disclosure.

FIG. 8 is an illustration of vertical cavity surface emitting laser (VCSEL) structure 800 according to an embodiment. A plurality of semiconductor layers 812 and 814 is arranged on top of a substrate 810. In this example, the semiconductor layers 812 are the layers comprised in the bottom distributed Bragg reflector (DBR), and the layer 814 is an n-contact layer. The mesa structure is arranged on top of the n-contact layer 814. In this example, the mesa structure comprises a plurality of layers that constitute n-type DBR 826, optical microcavity 824, oxide aperture layer 816, p-type DBR 822 and a top p-type contact layer 818. In this example the top dielectric DBR 828 is formed by plurality of layers of dielectric material. A first terminating oxide layer 830 of the first type is arranged on the first surface of the mesa structure 820. A second terminating oxide layer 832 of the second type is arranged on the second surface of the mesa structure. A third terminating oxide layer 840 is arranged on top of the n-contact layer 814.

Such terminating oxide layers provide an increase in energy barrier for the semiconductor device for improving carrier confinement within the stacked configuration of the plurality of semiconductor layers formed as a mesa structure. The terminating oxide layer prevents the uncontrolled oxidation of the surfaces present in 822, 826, 816, 818 and 824 providing a passivating effect. These could eliminate the need for enclosing such devices in hermetically sealed packages.

Figure 9A:
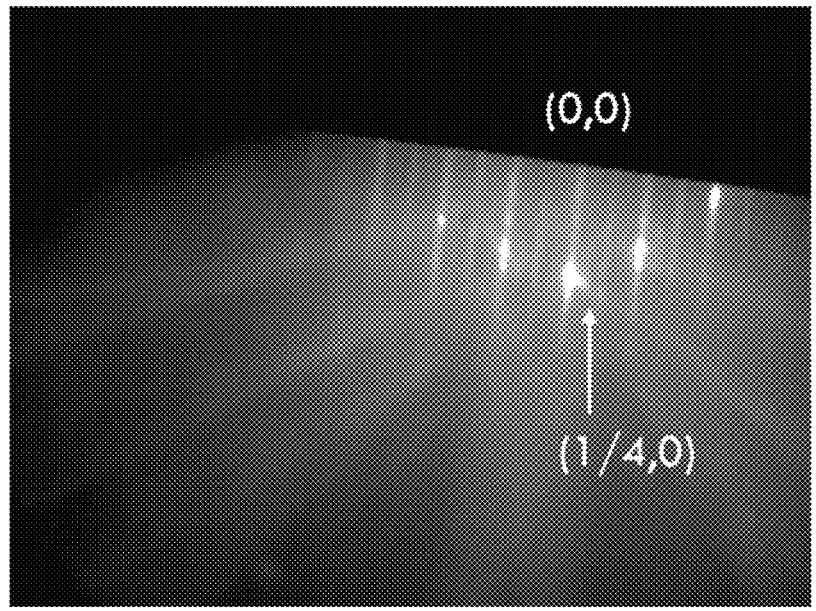
FIG. 9A shows reflection-high-energy-electron diffraction pattern from a surface of InGaAlP material cleaned.

FIG. 9A is an illustration of a reflection high energy electron diffraction pattern from a clean InGaAlP(001) material surface, cleaned as explained above. The diffraction pattern shows long range order of the surface with (2×4) surface symmetry (another azimuth not shown) indicating that the surface is successfully cleaned from native oxides and other contaminants and the surface is reconstructed to form clean (2×4) surface symmetry as an example.

Figure 9B:
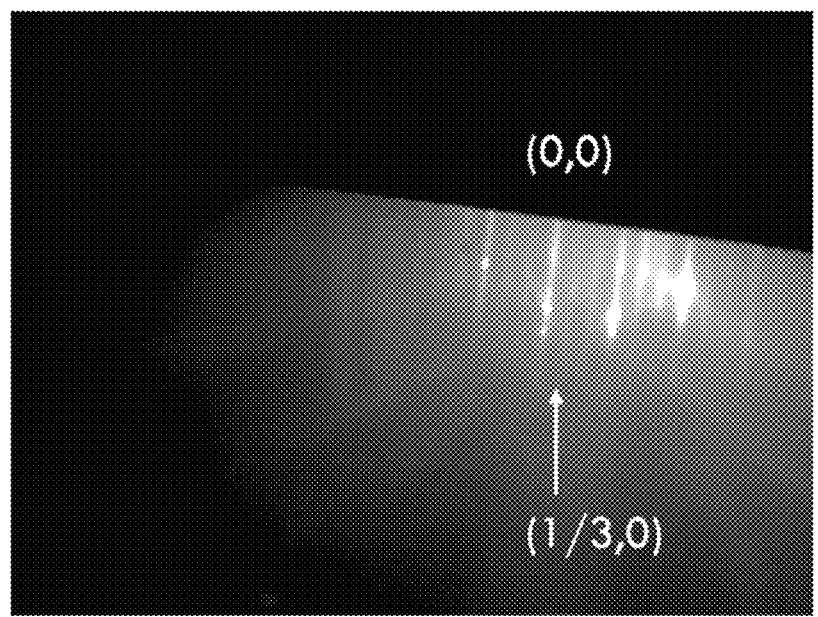
FIG. 9B shows reflection-high-energy-electron diffraction pattern from a surface of InGaAlP material passivated according to a tenth embodiment of the present disclosure.

FIG. 9B is an illustration a reflection high energy electron diffraction pattern from a InGaAlP(001) material surface with terminating oxide layer which is crystalline, according to the present disclosure. The diffraction pattern shows long range order of the surface with (3×1) surface symmetry in the planar (001) surface (another azimuth not shown), i.e. the terminating oxide layer is crystalline.

Figure 10A:
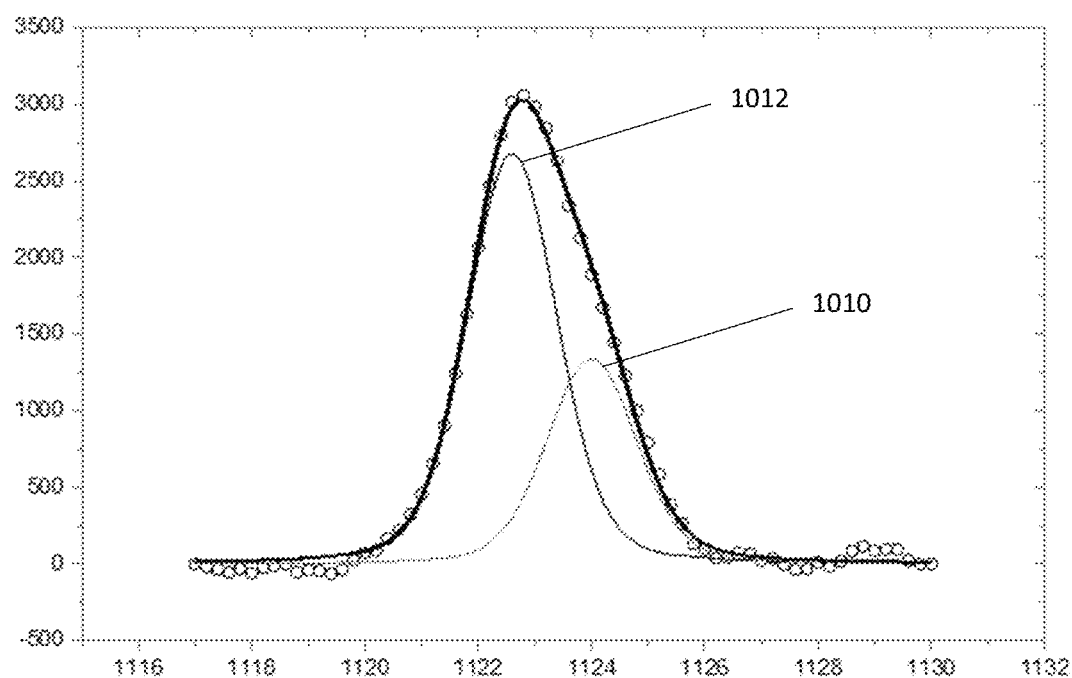
FIG. 10A shows Ga2p X-ray photoelectron spectra from a micro-LED device with native oxide layer on the mesa surfaces.

FIG. 10A is an illustration of a Ga2p x-ray photoelectron (XPS) spectra emission spectrum from an InGaAlP material based mesa structure with native oxide layer. The deconvoluted emission spectrum shows a component 1010 characteristics of Ga—O bonds. Furthermore, a component 1012 is characteristic for a bonding environment of Ga in the host semiconductor stack.

Figure 10B:
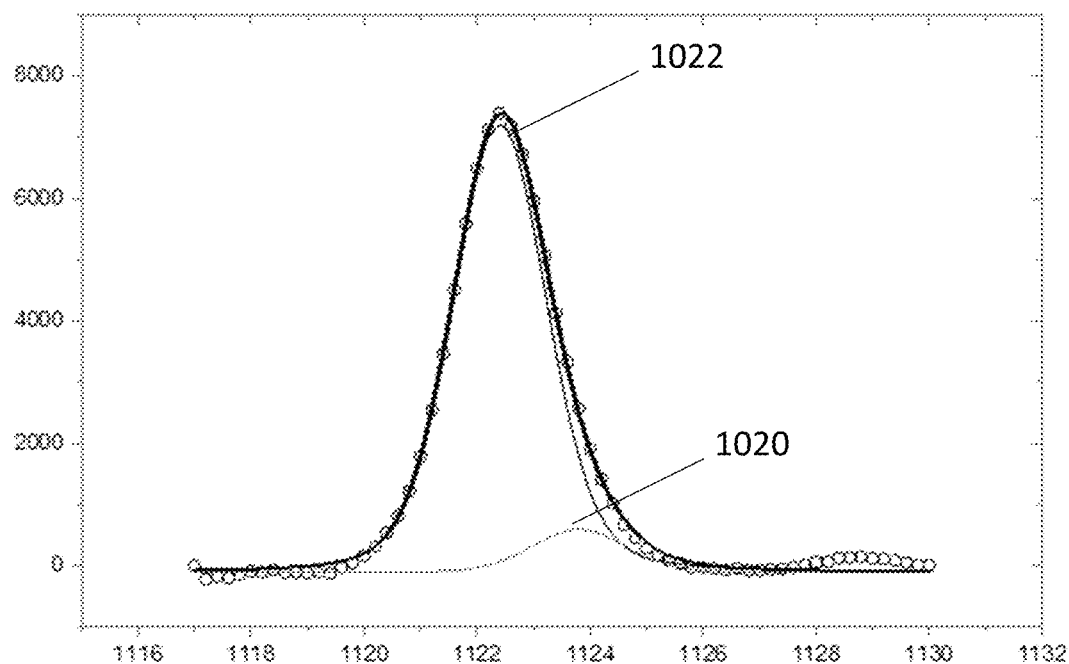
FIG. 10B is Ga2p X-ray photoelectron spectrum from a micro-LED device with terminating oxide layer according to an eleventh embodiment of the present disclosure.
Figure 10C:
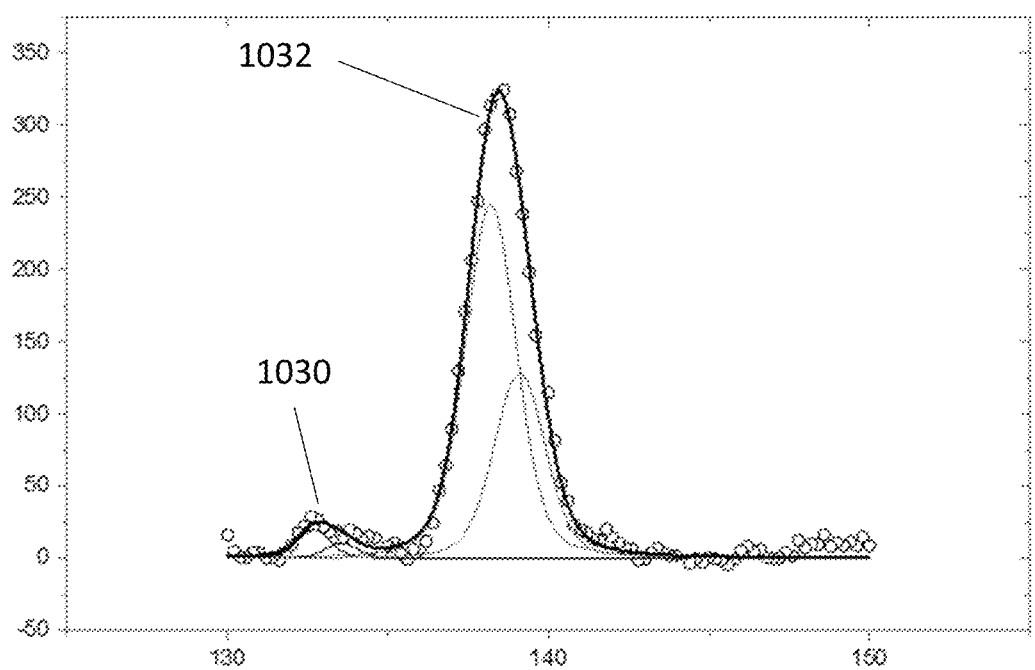
FIG. 10D is P2P X-ray photoelectron spectra from a micro-LED device with terminating oxide layer according to a twelfth embodiment of the present disclosure.

FIG. 10B is an illustration of a Ga2p x-ray photoelectron emission spectrum from an InGaAlP material-based mesa structure with terminating oxide layer according to an embodiment of the present disclosure. The deconvoluted emission spectrum shows a component 1020 characteristic of Ga—O bonds which is much smaller compared to case with native oxide layer. Furthermore, a component 1022 is characteristic for a bonding environment of Ga in the host semiconductor stack.

FIG. 10O is an illustration of a P2p x-ray photoelectron emission spectrum from an InGaAlP material-based mesa structure with native oxide layer. The deconvoluted emission spectrum shows a weak component 1030 characteristic for P bonds within the host semiconductor material and an intense component 1032 indicating the oxidized phosphorous.

Figure 10D:
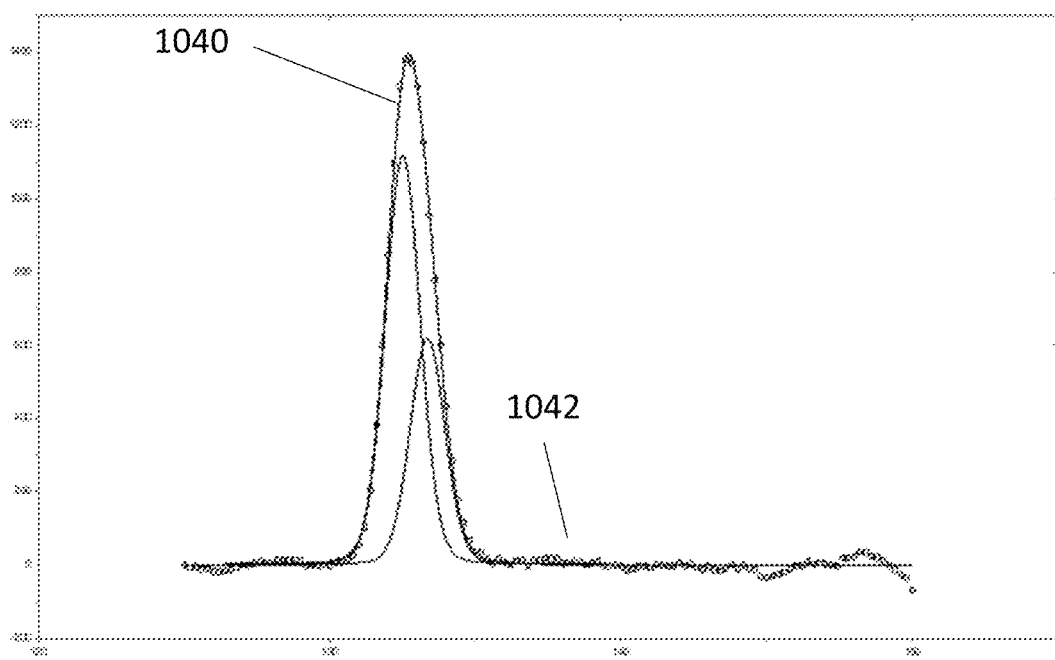

FIG. 10D is an illustration of a P2p x-ray photoelectron emission spectrum from an InGaAlP material-based mesa structure with terminating oxide layer, according to an embodiment. The deconvoluted emission spectrum shows a clear component 1040 characteristic for P bonds within the host semiconductor material. The component 1042 characteristic for phosphorous oxides is below detection limit of the XPS instrument.

Figure 11:
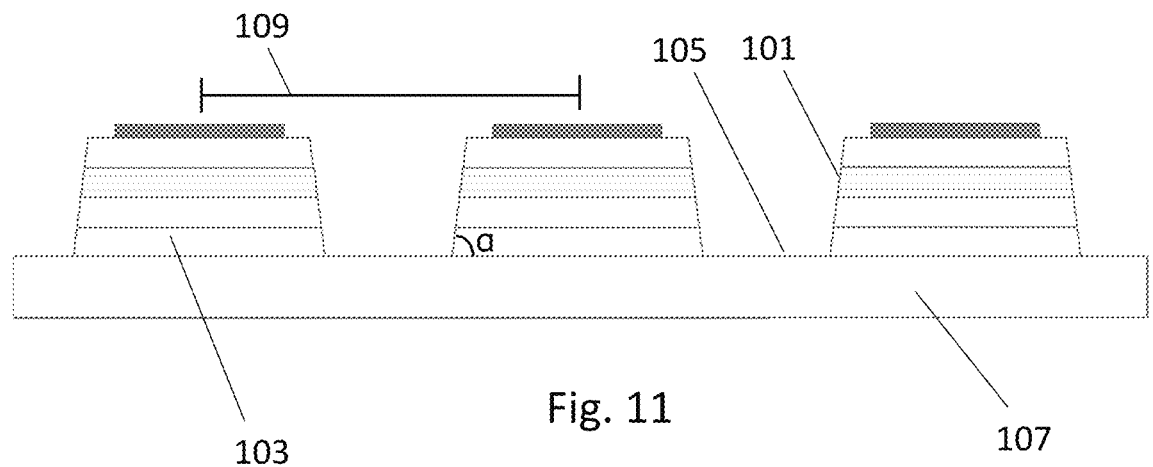
FIG. 11 is a schematic illustration of an optoelectronic device according to a thirteenth embodiment of the present disclosure.

FIG. 11 is a schematic illustration of a side view of an optoelectronic device similar to that shown in FIGS. 1A and 1B, according to an embodiment. It shows the angle α between the first surface 101 of the mesa structure 103 and the first surface plane 105 of the substrate layer 107. The line with reference number 109 shows the distance between centres of two adjacent mesa structures.

Figure 12:
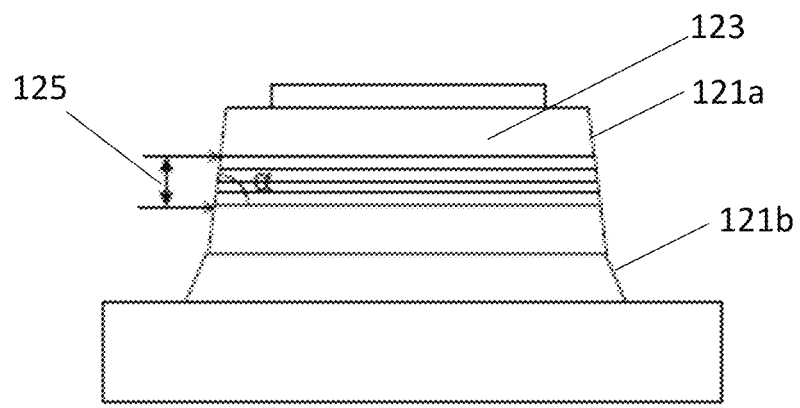
FIG. 12 is a schematic illustration of an optoelectronic device according to a fourteenth embodiment of the present disclosure.

FIG. 12 is a schematic illustration of an optoelectronic device according to a fourteenth embodiment of the present disclosure. In this embodiment, the first surface of the mesa structure 123 is in two parts, namely 121*a* and 121*b*, which are arranged at an angle with respect to one another. The angle α is measured as indicated in the FIG., i.e. along the active region 125 of the mesa structure.

Figure 13:
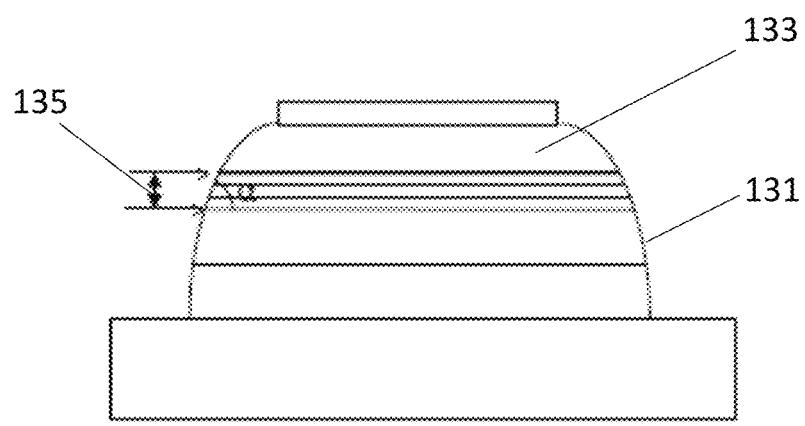
FIG. 13 is a schematic illustration of an optoelectronic device according to a fifteenth embodiment of the present disclosure.

FIG. 13 is a schematic illustration of an optoelectronic device according to a fifteenth embodiment of the present disclosure. In this embodiment, the first surface 131 of the mesa structure 133 is partly spherical, and the angle α is measured as indicated in the FIG, i.e. along the active region 135 of the mesa structure.

Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural.

The invention claimed is:

1. A method for manufacturing an optoelectronic device, the method comprising:
   obtaining a mesa structure arranged on a first surface plane of a substrate layer, the mesa structure comprising
   at least one layer of III-V material, and having
   a first surface oriented at an angle $\alpha$ relative to the first surface plane of the substrate layer, wherein the angle $\alpha$ is greater than 0° and less than 180°;
   cleaning the first surface of the mesa structure by removing at least 75% of native oxides from the first surface; and
   forming, by oxidizing exposed III-V material of the at least one layer of III-V material, a first terminating oxide layer of a first type on the first surface of the mesa structure, the first terminating oxide layer comprising at least 50 percent Group III oxides and less than 50 percent Group V oxides, and having a thickness of less than 10 nanometers.

2. The method according to claim 1, wherein the mesa structure further comprises a second surface that is parallel to the first surface plane of the substrate layer, and the method further comprises forming, by oxidizing exposed III-V material of the second surface, a second terminating oxide layer of a second type on the second surface of the mesa structure, the second terminating oxide layer comprising at least 50 percent Group III oxides and less than 20 percent Group V oxides, and having a thickness of less than 10 nanometers.

3. The method according to claim 1, further comprising removing the substrate layer after forming the first terminating oxide layer and the optional second terminating oxide layer.

4. The method according to claim 2, further comprising depositing an overcoating on the first terminating oxide layer.

5. The method according to claim 2, further comprising depositing an overcoating on the second terminating oxide layer.

6. The method according to claim 2, wherein the second terminating oxide layer of the second type is a crystalline oxide.

7. The method of claim 1, wherein the first terminating oxide layer is Group III-oxide-dominant such that Group III oxides constitute at least 60 percent of a total oxide composition of the first terminating oxide layer.

8. The method of claim 7, wherein the first terminating oxide layer comprises at least 70% Group III oxides.

9. The method of claim 1, wherein the first terminating oxide layer is Group III-oxide-dominant and comprises less than 20% Group V oxides.

10. The method of claim 1, wherein the thickness of the first terminating oxide layer is in a range of 1 nanometer to 5 nanometers.

11. The method of claim 1, wherein forming the first terminating oxide layer comprises oxidizing the mesa surface under vacuum conditions having a background pressure between $1\times10^{-11}$ mbar and $1\times10^{-7}$ mbar, at a temperature between 200° C. and 750° C., while supplying oxygen or ozone, wherein the oxygen comprises molecular or atomic oxygen species.

* * * * *